(12) United States Patent
Hamaguchi et al.

(10) Patent No.: US 9,799,489 B2
(45) Date of Patent: Oct. 24, 2017

(54) EXPOSURE APPARATUS

(71) Applicant: ADVANTEST CORPORATION, Tokyo (JP)

(72) Inventors: Shinichi Hamaguchi, Tokyo (JP); Hitoshi Tanaka, Tokyo (JP); Atsushi Tokuno, Tokyo (JP); Shinichi Kojima, Tokyo (JP); Akio Yamada, Tokyo (JP)

(73) Assignee: Advantest Corp., Tokyo (JP)

( * ) Notice: Subject to any disclaimer, the term of this patent is extended or adjusted under 35 U.S.C. 154(b) by 0 days.

(21) Appl. No.: 15/402,500

(22) Filed: Jan. 10, 2017

(65) Prior Publication Data
US 2017/0229285 A1    Aug. 10, 2017

(30) Foreign Application Priority Data

Feb. 4, 2016  (JP) ................................. 2016-019442

(51) Int. Cl.
*G03B 27/02*   (2006.01)
*G03B 27/52*   (2006.01)
(Continued)

(52) U.S. Cl.
CPC ........ *H01J 37/3177* (2013.01); *H01J 37/065* (2013.01); *H01J 37/09* (2013.01); *H01J 2237/0453* (2013.01)

(58) Field of Classification Search
USPC ..... 250/298, 306, 307, 309, 396 ML, 396 R, 250/492.22, 492.23, 492.3, 505.1, 526
See application file for complete search history.

(56) References Cited

U.S. PATENT DOCUMENTS

| 4,980,558 A | 12/1990 | Rose et al. |
| 8,445,869 B2 * | 5/2013 | Wieland ............. H01J 37/1471 250/398 |

(Continued)

FOREIGN PATENT DOCUMENTS

| JP | 2013-016744 | 1/2013 |
| JP | 2015-133400 | 7/2015 |

OTHER PUBLICATIONS

A. D. Brodie "An electron beam line probe with variable aspect ratio", Journal of Vacuum Science & Technology, B8 No. 6, Nov./Dec. 1990.

*Primary Examiner* — Bernard Souw
(74) *Attorney, Agent, or Firm* — Muramatsu & Associates

(57) ABSTRACT

The invention provides an exposure apparatus (100) including a formation module (122) which forms charged particle beams with different irradiation positions on a specimen. The formation module (122) includes: a particle source (20) which emits the charged particle beams from an emission region (21) in which a width in a longitudinal direction is different from and a width in a lateral direction orthogonal to the longitudinal direction; an aperture array device (60) provided with openings (62) arranged in an illuminated region (61) in which a width in a longitudinal direction is different from a width in a lateral direction orthogonal to the longitudinal direction; illumination lenses (30, 50) provided between the particle source (20) and the aperture array device (60); and a beam cross-section deformation device (40) which is provided between the particle source (20) and the aperture array device (60), and deforms a cross-sectional shape of the charged particle beams into an anisotropic shape by an action of a magnetic field or an electric field.

10 Claims, 12 Drawing Sheets

(51) Int. Cl.
*H01J 37/30* (2006.01)
*H01J 37/317* (2006.01)
*H01J 37/09* (2006.01)
*H01J 37/065* (2006.01)

(56) References Cited

U.S. PATENT DOCUMENTS

| | | | |
|---|---|---|---|
| 8,502,174 B2 * | 8/2013 | Wieland | B82Y 10/00 250/310 |
| 8,658,985 B2 * | 2/2014 | Hirata | H01J 37/3177 250/396 R |
| 8,859,983 B2 * | 10/2014 | Wieland | B82Y 10/00 250/396 R |
| 8,890,094 B2 * | 11/2014 | Wieland | B82Y 10/00 250/396 R |
| 9,478,396 B2 * | 10/2016 | Hamaguchi | H01J 37/3177 |
| 9,653,261 B2 * | 5/2017 | Van Veen | H01J 37/3174 |
| 2013/0011796 A1 | 1/2013 | Hirata | |
| 2015/0200074 A1 * | 7/2015 | Hamaguchi | H01J 37/3177 250/396 R |

* cited by examiner

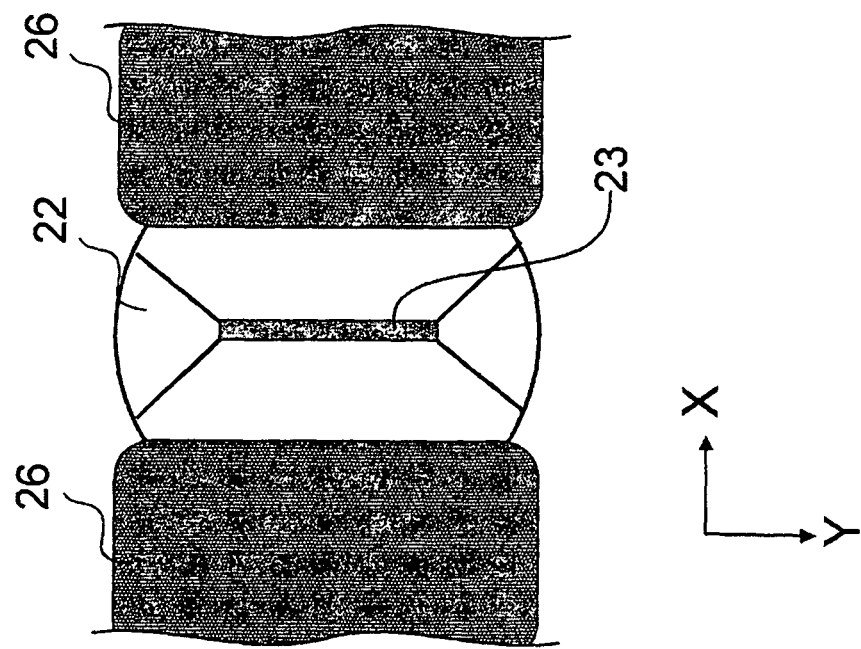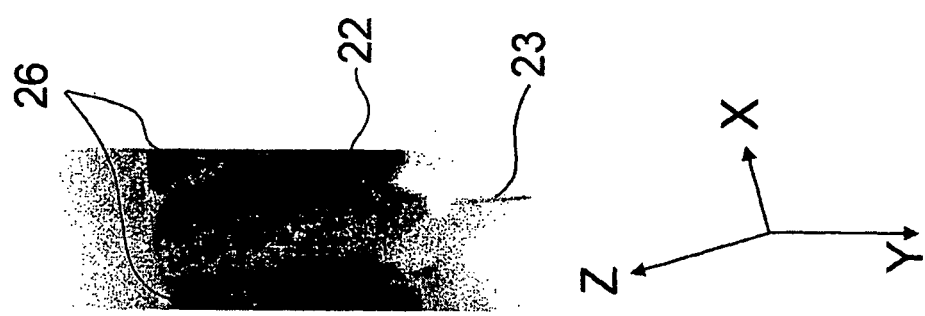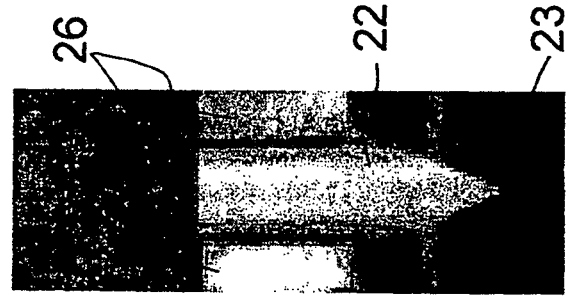

EXPOSURE APPARATUS

CROSS REFERENCE TO RELATED APPLICATION(S)

This application is based upon and claims the benefit of priority of the prior Japanese Patent Application No. 2016-19442, filed on Feb. 4 2016, the entire contents of which are incorporated herein by reference.

TECHNICAL FIELD

The embodiments discussed herein are related to an exposure apparatus which uses a charged particle beam.

BACKGROUND ART

Complementary lithography has been known to produce a fine circuit pattern by forming a simple line pattern with an optical exposure technique designed for a line width of several tens of nanometers, and then processing the line pattern with another exposure technique using a charged particle beam such as an electron beam (Patent Literature 1).

Meanwhile, there has also been known a multi-beam exposure technique using an array beam arranged in a one-dimensional direction (Patent Literature 2).

CITATION LIST

Patent Literature

Patent Literature 1: Japanese Laid-open Patent Publication No. 2013-16744
Patent Literature 2: Japanese Laid-open Patent Publication No. 2015-133400

SUMMARY OF INVENTION

Technical Problem

To further enhance a processing capacity (throughput) of the exposure apparatus, it is desirable to increase a current value of each of beams constituting the array beam.

However, it turned out that when the array beam arranged in the one-dimensional direction (see Patent Literature 2) is formed by using the conventional exposure apparatus, the current value of each of beams constituting the array beam is insufficient for performing the exposure at a practical rate.

In view of the above, it is an object of the present invention to provide an exposure apparatus which includes a beam formation unit capable of increasing a current value of each of beams constituting an array beam.

Solution to Problem

An aspect disclosed hereafter provides an exposure apparatus including a formation module configured to form a plurality of charged particle beams with different irradiation positions on a specimen. The formation module includes: a particle source configured to emit the charged particle beams from an emission region in which a width in a longitudinal direction is different from a width in a lateral direction orthogonal to the longitudinal direction; an aperture array device provided with a plurality of openings arranged in an illuminated region in which a width in a longitudinal direction is different a width in a lateral direction orthogonal to the longitudinal direction; an illumination lens provided between the particle source and the aperture array device; and a beam cross-section deformation device provided between the particle source and the aperture array device, and configured to deform a cross-sectional shape of the charged particle beams into a longer and thinner shape than a shape of the emission region by an action of any of a magnetic field and an electric field.

In addition, in the above exposure apparatus, the particle source may include a cathode unit having a tip end provided with a generation portion configured to generate charged particles, the generation portion in which a width in a longitudinal direction is different from a width in a lateral direction orthogonal to the longitudinal direction, and a control electrode provided with an opening in which a width in a longitudinal direction is different from a width in a lateral direction orthogonal to the longitudinal direction, the illumination lens may be formed from at least two axisymmetric charged particle beam lens, the lenses being disposed at different positions, and the beam cross-section deformation device may be disposed at a position where an image of the emission region is focused with the particle source-side illumination lens.

Advantageous Effects of Invention

According to the above-mentioned exposure apparatus, a current value of each of beams constituting an array beam is increased, whereby a processing capacity of the apparatus is enhanced.

It is to be noted that this summary of invention does not enumerate all of the features included in the following contents of disclosure, and that sub-combinations of groups of the features included in the following contents of disclosure can also constitute the invention.

BRIEF DESCRIPTION OF DRAWINGS

FIG. 6A is a front view of a cathode unit and heating units of FIG. 5, FIG. 6B is a perspective view of the cathode unit and the heating unit of FIG. 5, and
FIG. 6C is a bottom view of the cathode unit and the heating unit of FIG. 5.

DESCRIPTION OF EMBODIMENTS

The present invention will be described below with reference to certain embodiments. It is to be noted, however, that the following embodiments are not intended to limit the scope of the invention as defined in the appended claims. It is to be also understood that a solution according to the present invention does not necessarily require all of combinations of the features described in the embodiments.

First Embodiment

Figure 1:
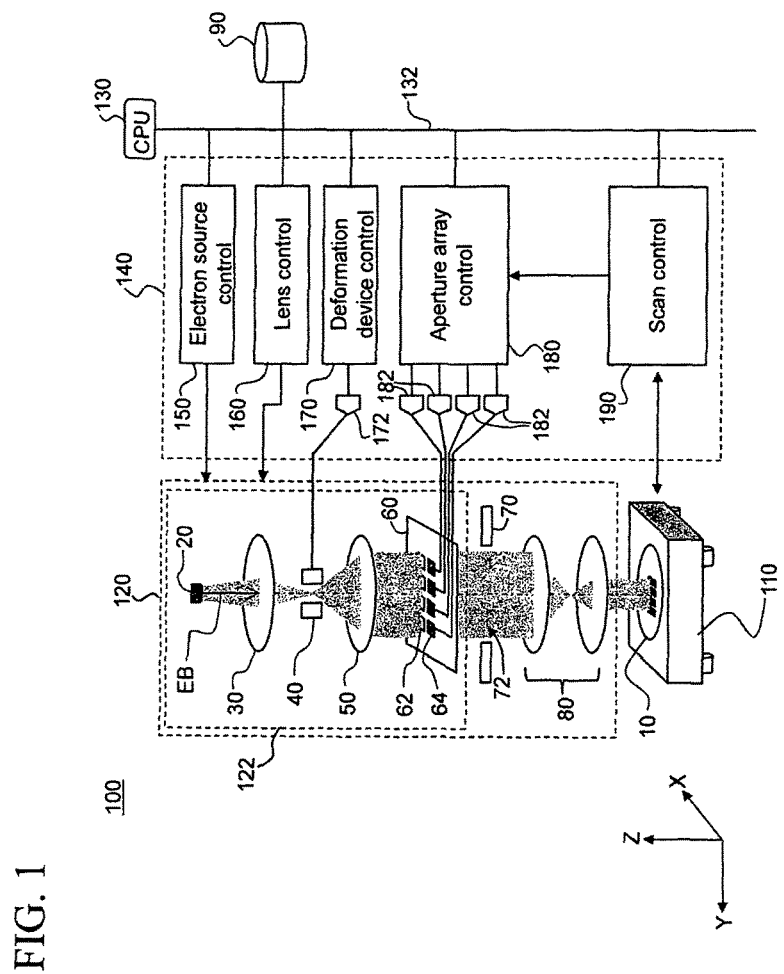
FIG. 1 is a block diagram showing a configuration of an exposure apparatus according to a first embodiment.

FIG. 1 shows a configuration example of an exposure apparatus 100 of this embodiment.

The exposure apparatus 100 exposes a cut pattern or a via-hole pattern to a line pattern on a specimen formed on the basis of a predetermined grid, by irradiating the line pattern with a charged electron beam having an irradiation position and an irradiation range corresponding to the grid.

This exposure apparatus 100 includes a stage unit 110, a column unit 120, a CPU 130, and an exposure control unit 140.

A specimen 10 as an object of exposure may be a substrate made of semiconductor, glass, and/or a ceramic. For example, the specimen 10 is a semiconductor wafer made of silicon or the like. A line pattern made of conductor such as a metal may be formed on a surface of the specimen 10.

The exposure apparatus 100 is suitable for the purpose of exposure on a resist formed on the line pattern of the specimen 10 in order to cut out and thus perform microfabrication (such as formation of electrodes, wires, and/or via-holes) on the line pattern.

The specimen 10 is mounted on the stage unit 110. The stage unit 110 mounts and moves the specimen 10 on an XY plane shown in FIG. 1. The stage unit 110 may be an XY stage, or a combination of the XY stage with one or more of a Z stage, a rotary stage, and a tilting stage.

The stage unit 110 mounts the specimen 10 such that a longitudinal direction of the line pattern formed on the specimen 10 is aligned substantially parallel to a moving direction of the stage such as an X direction and a Y direction.

The following description will represent an example in which the stage unit 110 is the XY stage, which moves in the X direction and the Y direction in FIG. 1, and mounts the specimen 10 such that the longitudinal direction of the line pattern is substantially aligned parallel to the X direction.

The column unit 120 irradiates the specimen 10 mounted on the stage unit 110 with a charged electron beam containing charged particles such as electrons and ions. Note that this embodiment will describe an example in which the column unit 120 emits an electron beam.

The column unit 120 includes: a formation module 122 to form a plurality of portions of an electron beam with irradiation positions on the specimen 10 being different from one another; a stopping plate 70; and a reduction projection lens 80.

Among them, the formation module 122 includes an electron source 20, an electron source-side illumination lens 30, a beam cross-section deformation device 40, an aperture array-side illumination lens 50, and an aperture array device 60.

The electron source 20 includes a generation portion to generate electrons by application of heat or an electric field. In the generation portion for the electrons, a width in a longitudinal direction is different from a width in a lateral direction orthogonal thereto.

A predetermined acceleration voltage (50 KV, for example) is applied from the electron source 20 to the electrons generated by the generation portion. Thus, the electrons are accelerated in a direction toward the specimen 10, which is a −Z direction in FIG. 1, and are formed into an electron beam EB.

The electron source 20 may be provided on an optical axis (a chain dashed line in FIG. 1) of the electron beam, which is a perpendicular being parallel to the Z axis and orthogonal to a surface of the specimen 10 being parallel to the XY plane.

The electron beam EB emitted from the electron source 20 is converged by the illumination lenses.

The illumination lenses include at least two illumination lenses disposed at different positions, namely, the electron source-side illumination lens 30 and the aperture array-side illumination lens 50. These illumination lenses are each an electron beam lens axisymmetric with respect to the optical axis where the electron beam passes.

Among them, the electron source-side illumination lens 30 is provided between the electron source 20 and the aperture array-side illumination lens 50, and forms the electron beam emitted from the electron source 20 into an image on the −Z direction side of the electron source-side illumination lens 30.

The beam cross-section deformation device 40 is provided between the electron source-side illumination lens 30 and the aperture array-side illumination lens 50, and deforms a cross-section of the electron beam, which has passed through the electron source-side illumination lens 30 and has the width in the longitudinal direction different from the width in the lateral direction orthogonal thereto, by expanding the cross-section further in the longitudinal direction.

Here, the cross-section of the electron beam means a shape of a cutting plane of the electron beam when the electron beam is cut along a plane (a plane parallel to the XY plane) which is orthogonal to a traveling direction of the electron beam.

In the example of FIG. 1, the beam cross-section deformation device 40 forms an electron beam which is expanded in the Y direction being the longitudinal direction of the cross-section of the electron beam.

The beam cross-section deformation device 40 is a quadrupole, for example, which deforms the cross-section of the electron beam by generating a magnetic field or an electric field and thus applying a force in the direction within the plane of the cross-section to the electron beam.

The aperture array-side illumination lens 50 is provided between the beam cross-section deformation device 40 and the aperture array device 60, and transforms the electron beam having passed through the beam cross-section deformation device 40 into a substantially parallel electron beam directed toward the specimen 10.

The aperture array device 60 is provided between the aperture array-side illumination lens 50 and the specimen 10. In the example of FIG. 1, the aperture array device 60 is illuminated with the electron beam of which the width in the Y direction being the longitudinal direction of the cross-section of the electron beam is different from the width in the X direction being the lateral direction orthogonal thereto.

The aperture array device 60 is provided with a plurality of openings 62 arranged in the Y direction being the longitudinal direction. All these openings 62 have the same size, and are disposed at predetermined intervals in the Y direction.

The aperture array device 60 cuts an electron beam group in an arrayed form composed of portions of the electron beam passing through the openings 62, out of the electron beam to illuminate the aperture array device 60, thereby forming an array beam.

The aperture array device 60 is further provided with a plurality of blanking electrodes 64. These blanking electrodes 64 are disposed beside the plurality of openings 62 arranged in the Y direction, respectively.

When a voltage is applied to each blanking electrode 64, an electric field is generated inside the corresponding opening 62 and in a direction orthogonal to the traveling direction of the electron beam.

Specifically, when the voltage is applied to each blanking electrode 64, the electric field is generated inside the corresponding opening 62. Accordingly, the electron beam incident on the opening 62 is deflected to a direction different from the direction of passage of the electron beam toward the specimen 10.

On the other hand, when the voltage is not applied to the blanking electrode 64, no electric field is generated inside the corresponding opening 62. As a consequence, the electron beam incident on the opening 62 passes through the opening 62 toward the specimen 10 without being deflected.

The stopping plate 70 is provided between the aperture array device 60 and the specimen 10, and blocks the electron beam deflected by the blanking electrodes 64 of the aperture array device 60.

The stopping plate 70 is provided with an opening 72. The opening 72 may have a substantially oval or substantially rectangular shape extending in one direction, and may be formed such that the center of the opening 72 intersects with a straight line connecting the electron source 20 with the specimen 10. In the example of FIG. 1, the opening 72 has a shape extending in the direction parallel to the Y axis.

The opening 72 of the stopping plate 70 allows the passage of the electron beam which has passed through the aperture array device 60 without being deflected. On the other hand, the electron beam deflected by the aperture array device 60 is guided to the outside of the opening 72 of the stopping plate 70 and its travel is thus blocked.

In other words, the column unit 120 switches between a state (a beam-on state) of allowing irradiation of the specimen 10 with each portion of the electron beam included in the array beam and a state (a beam-off state) of not allowing the irradiation, by controlling the voltage to be applied to each blanking electrode 64 while combining the aperture array device 60 with the stopping plate 70.

The reduction projection lens 80 is provided between the stopping plate 70 and the specimen 10, and forms a reduced image of each opening 62 on the surface of the specimen 10 by using the electron beam in the beam-on state out of the electron beam having passed through the opening 62 of the aperture array device 60.

The above-mentioned reduction projection lens 80 may be an electromagnetic lens which is axisymmetric with respect to the optical axis where the electron beam passes.

Alternatively, the reduction projection lens 80 may be split into an electron beam lens mainly having a function to reduce the size of the cross-section of the electron beam, and another electron beam lens mainly having a function to focus the electron beam on the specimen 10.

In the above-described column unit 120 of this embodiment, the formation module 122 forms the plurality of portions of the electron beam (the array beam) which are arranged in the predetermined direction.

Each of the blanking electrodes 64 of the aperture array device 60 performs the switching in conjunction with the stopping plate 70 as to whether or not to irradiate the specimen 10 with the corresponding portion of the electron beam.

The direction to arrange the portions of the electron beam in the formation module 122 is determined based on the longitudinal direction of the cross-section of the electron beam emitted from the electron source 20, the direction of expansion and deformation of the beam cross-section by the beam cross-section deformation device 40, the longitudinal direction of the electron beam illuminating the aperture array device 60, the direction of arrangement of the openings 62 on the aperture array device 60, and the like.

The column unit 120 aligns the aforementioned directions substantially with the direction orthogonal to the moving direction of the stage unit 110, and then the stage unit 110 mounts the specimen 10 so as to substantially align the moving direction with the longitudinal direction of the line pattern on the specimen 10, thereby generating the portions of the electron beam of which the irradiation positions are different from one another in the width direction of the line pattern.

This embodiment describes an example in which the column unit 120 emits the array beam arranged in the Y direction, which is the perpendicular direction to the line pattern substantially parallel to the X direction.

A control system of the exposure apparatus 100 will be described below.

The CPU 130 controls the entire exposure apparatus 100.

The CPU 130 is formed from a computer, a workstation, and the like, and has a function as an input terminal used for inputting operation instructions from a user. Moreover, the CPU 130 is connected to the exposure control unit 140, and controls an exposure operation of the exposure apparatus 100 in response to the user input.

The CPU 130 is connected to respective modules included in the exposure control unit 140 through a bus 132, for example, and exchanges control signals and the like with the modules.

The exposure control unit 140 is connected to the stage unit 110 and the column unit 120. The exposure control unit 140 controls the stage unit 110 and the column unit 120 in response to signals and the like such as the control signals received from the CPU 130, thereby executing the exposure operation on the specimen 10.

Meanwhile, the exposure control unit 140 is connected to an external storage unit 90 through the bus 132, and exchanges data and the like such as pattern data stored in the external storage unit 90.

The above-mentioned exposure control unit 140 further includes an electron source control module 150, a lens control module 160, a deformation device control module 170, an aperture array control module 180, and a scanning control module 190.

The electron source control module 150 is connected to the electron source 20 being part of the formation module 122. The electron source control module 150 outputs a heater current to heat the electron source 20, and causes the electron source 20 to emit thermal electrons. Meanwhile, the electron source control module 150 applies the acceleration voltage (50 KV, for example) to the electron source 20, and accelerates the thermal electrons emitted from the electron source 20 toward the specimen 10.

The lens control module 160 is connected to the electron source-side illumination lens 30, the aperture array-side illumination lens 50, the reduction projection lens 80, and the like which collectively constitute the column unit 120. The lens control module 160 outputs currents to lens coils of these electromagnetic lenses, and thus generates lens magnetic fields.

The lens control module 160 sets lens strengths of the electron source-side illumination lens 30, the aperture array-side illumination lens 50, the reduction projection lens 80, and the like by controlling the currents to be fed to the lens coils.

The deformation device control module 170 is connected via a deformation device drive circuit 172 to the beam cross-section deformation device 40 which is part of the formation module 122. Moreover, the deformation device control module 170 sets a value corresponding to an amount of deformation of the beam cross-section by the beam cross-section deformation device 40, to the deformation device drive circuit 172.

Upon receipt of the set value from the deformation device control module 170, the deformation device drive circuit 172 outputs a drive current to drive the beam cross-section deformation device 40 formed from a magnetic quadrupole, for example. Instead, upon receipt of the set value from the deformation device control module 170, the deformation device drive circuit 172 may output a drive voltage to drive the beam cross-section deformation device 40 formed from an electric quadrupole.

The aperture array control module 180 is connected via blanking drive circuits 182 to the blanking electrodes 64 disposed on the aperture array device 60. This aperture array control module 180 generates signals for switching the portions of the electron beam constituting the array beam between the on-state and the off-state one by one, and sets each signal to the corresponding blanking drive circuit 182.

Upon receipt of the switching signal from the aperture array control module 180, each blanking drive circuit 182 applies a deflection voltage (a blanking voltage) for achieving beam blanking to the corresponding blanking electrode 64 of the aperture array device 60.

The aperture array control module 180 receives pattern data on a cut pattern to be exposed by the exposure apparatus 100 so as to cut out the line pattern formed on the specimen 10, or pattern data on a via-hole pattern to be exposed by the exposure apparatus 100 so as to form a via hole in the specimen 10. Such pattern data are received from the external storage unit 90, for example.

Then, based on these pattern data, the aperture array control module 180 generates the signals for switching the portions of the electron beam constituting the array beam between the on-state and the off-state.

The scanning control module 190 is connected to the stage unit 110, and generates a stage operation signal for performing scanning while moving the irradiation positions of the portions of the electron beam constituting the array beam along the longitudinal direction of the line pattern. The scanning control module 190 of this embodiment causes the array beam to perform scanning along the longitudinal direction of the line pattern by moving the stage unit 110 mounting the specimen 10 in the direction substantially parallel to the X direction.

Moreover, the scanning control module 190 is connected to the stage unit 110, and receives a detection result of a stage position of the stage unit 110. The scanning control module 190 may acquire an amount of actual movement of the stage unit 110, a stage position error, and the like based on the detection result of the stage position, and feed the acquired information back to movement control of the stage unit 110.

Furthermore, the scanning control module 190 is connected to the aperture array control module 180, and supplies the position information on the stage unit 110 to the aperture array control module 180.

Based on the position information on the stage unit 110, the aperture array control module 180 determines a timing to irradiate the line pattern on the specimen 10 with each of the portions of the electron beam constituting the array beam, i.e., a timing to output the signal for switching each portion of the electron beam between the on-state and the off-state.

Figure 2:
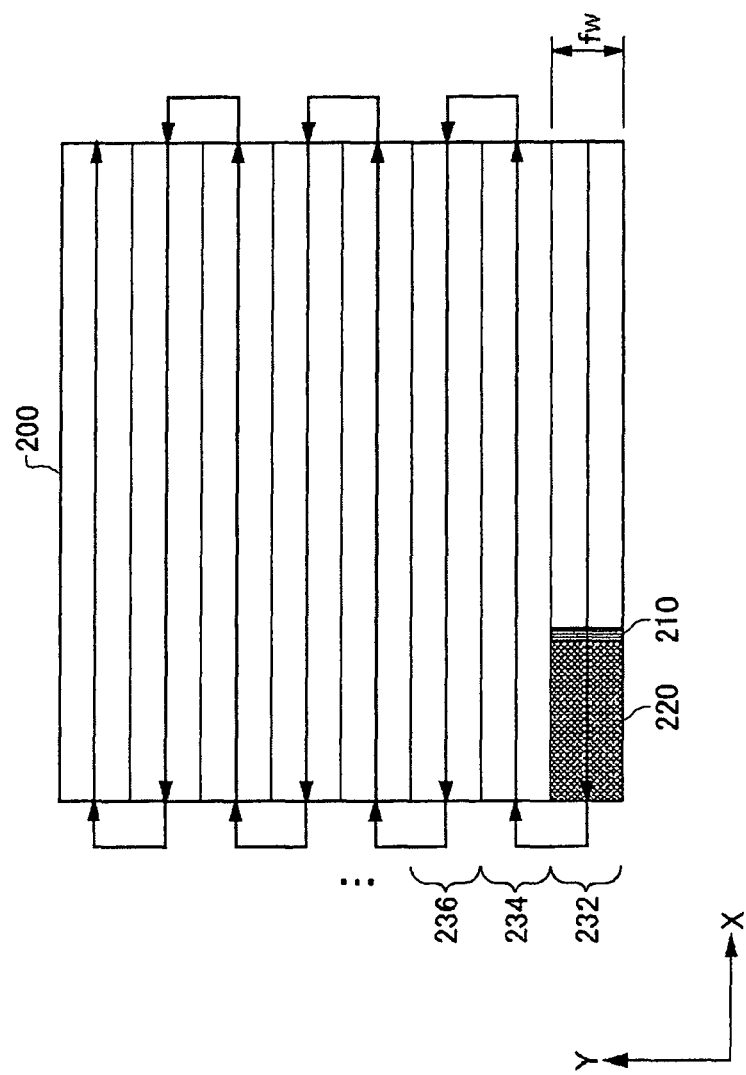
FIG. 2 is a plan view showing an irradiatable region to be formed on a surface of a specimen by causing the exposure apparatus of FIG. 1 to perform scanning with an array beam.

FIG. 2 shows an irradiatable region 200 to be formed on part of the surface of the specimen 10 by causing the exposure apparatus 100 of this embodiment to perform the scanning with the array beam. Note that FIG. 2 shows the surface of the specimen 10 substantially parallel to the XY plane, in which code fw indicates an overall width of the portions of the electron beam arranged in the Y direction (which is a width direction of a line in the line pattern) being the longitudinal direction of the array beam irradiated by the exposure apparatus 100. Here, the beam width fw is about 60 m, for example.

The scanning control module 190 moves the specimen 10 in the longitudinal direction (the X direction) of the line pattern by using the stage unit 110 while maintaining routes of passage of the respective portions of the electron beam.

In the example of FIG. 2, the scanning control module 190 first moves the stage unit 110 in the −X direction. When viewed on the basis of the specimen 10, this is equivalent to movement of an irradiation position 210 of the array beam in the +X direction on the surface of the specimen 10. Then, the array beam irradiates a strip-shaped region 220 with the electron beam.

In other words, the scanning control module 190 moves the stage unit 110 by a predetermined distance in the X direction, and thus defines a first frame 232 as an irradiatable sub-region. Here, the first frame 232 has an area of 30 mm×60 m, for example.

Next, the scanning control module 190 moves the stage unit 110 by the beam width fw of the array beam in the −Y direction, and then moves the stage unit 110 back in the +X direction by the predetermined distance equal to the previous movement in the −X direction.

Thus, the irradiation position 210 of the array beam moves in the −X direction in another region on the surface of the specimen 10 different from the first frame 232, thereby defining a second frame 234, which has substantially the same area as the first frame 232 and is located adjacent thereto in the +Y direction, as another irradiatable sub-region. Likewise, the scanning control module 190 moves the stage unit 110 by the beam width fw of the array beam in the −Y direction, and then again moves the stage unit 110 back in the −X direction by the predetermined distance, thereby defining a third frame 236 as another irradiatable sub-region.

In this way, the scanning control module 190 reciprocates the stage unit 110 in the X direction being the longitudinal direction of the line pattern, and defines a predetermined region on the surface of the specimen 10 as an irradiatable region 200 with the array beam. Here, the scanning control module 190 defines a 30×30-mm square region as the irradiatable region 200, for example.

Here, the irradiatable region 200 is not limited to the square region but may be designed in various shapes depending on the shape of the specimen 10.

The exposure apparatus 100 according to the above-described embodiment reciprocates the stage unit 110 in the X direction being the longitudinal direction of the line pattern, and irradiates the irradiation position on the line pattern with the corresponding array beam, thereby performing the exposure on the specimen 10.

Specifically, the exposure apparatus 100 exposes the pattern to the line pattern in the irradiatable region 200 with the array beam, by switching each of the portions of the electron beam constituting the array beam between the on-state and the off-state at the position corresponding to the cut pattern or the via-hole pattern to be formed.

Figure 3:
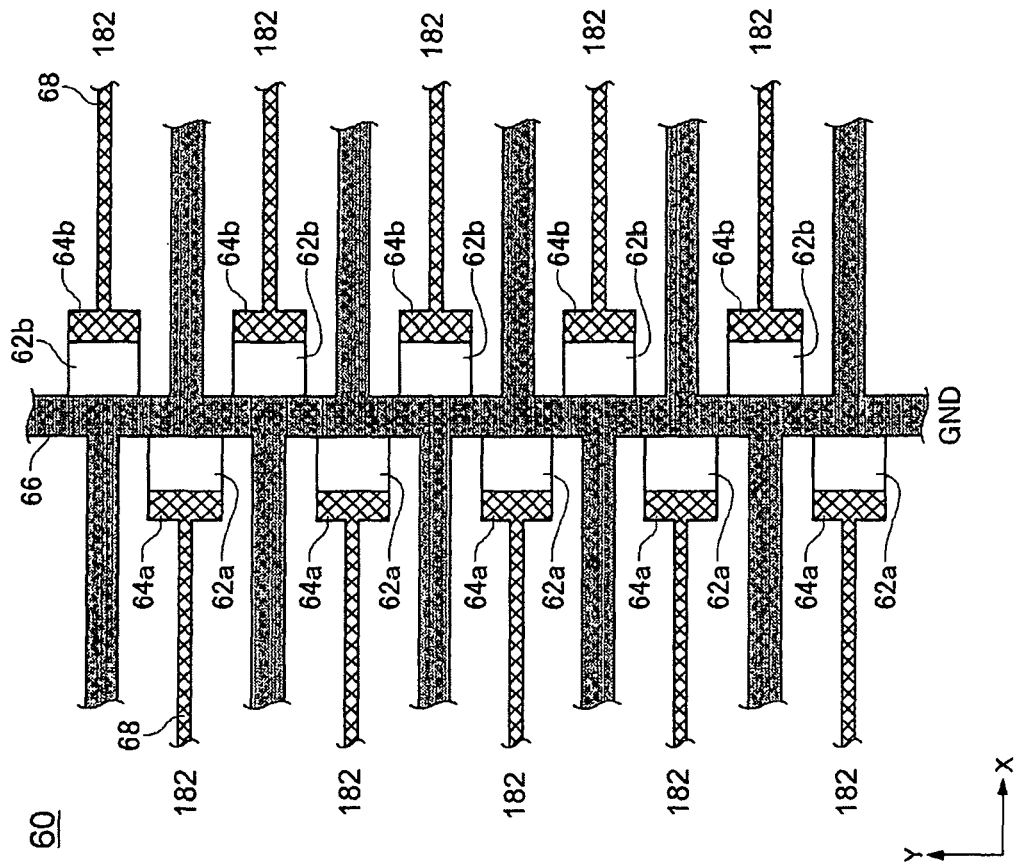
FIG. 3 is a partially enlarged diagram of an aperture array device in the exposure apparatus of FIG. 1.

FIG. 3 is a partially enlarged diagram of the aperture array device in the exposure apparatus of FIG. 1.

The exposure apparatus 100 switches each of the portions of the electron beam constituting the array beam between the on-state and the off-state, by switching whether or not to deflect each portion of the electron beam in response to the voltage to be applied to the corresponding blanking electrode 64 in the aperture array device 60. To this end, the aperture array device 60 includes the openings 62, first blanking electrodes 64a, second blanking electrodes 64b, a common electrode 66, and electrode wires 68.

The electron beam is deformed by the beam cross-section deformation device 40 into such a shape with the elongated cross-section, and is transformed into the substantially parallel beam by the aperture array-side illumination lens 50. The transformed electron beam illuminates the region on the aperture array device 60 inclusive of the openings 62.

The openings 62 cut out the portions of the electron beam illuminating the portions of the openings 62 from the electron beam illuminating the region, and causes the portions of the electron beam to individually pass therethrough. The electron beam having passed through the openings 62 forms the array beam consisting of the portions of the electron beam. The aperture array device 60 is provided with the openings 62 in the number corresponding to the portions of the electron beam to be outputted as the array beam.

In the example of FIG. 3, the openings 62 include first openings 62a and second openings 62b, which are separately provided on two sides along the X direction being the direction corresponding to the longitudinal direction of the line pattern. The first openings 62a are the openings 62 located on the −X-direction side and arranged in the Y direction. The second openings 62b are the openings 62 located on the +X-direction side and arranged in the Y direction.

Each first blanking electrode 64a is provided on a wall surface of the first opening 62a on the opposite side from the common electrode 66. Each second blanking electrode 64b is provided on a wall surface of the second opening 62b on the opposite side from the common electrode 66.

The common electrode 66 is an electrode shared by the first openings 62a and the second openings 62b, which is provided on a wall surface between the first openings 62a and the second openings 62b in the X direction. The common electrode 66 is set to a constant voltage such as ground potential.

Moreover, the common electrodes 66 may be provided between the adjacent openings 62, respectively, among the openings 62 arranged in the Y direction.

By isolating the adjacent openings 62 from each other by using the common electrode 66 as described above, it is possible to block a leakage of an electric field from any of the adjacent blanking electrodes 64, and thus to prevent an electron beam path from suffering unintended displacement.

Each electrode wire 68 connects each of the first blanking electrodes 64a and the second blanking electrodes 64b to the corresponding blanking drive circuit 182 (see FIG. 1).

The aperture array control module 180 and the blanking drive circuits 182 supply the blanking voltage to the first blanking electrodes 64a or the second blanking electrodes 64b, thereby switching each of the portions of the electron beam between the on-state and the off-state.

In the example of FIG. 3, the aperture array device 60 includes the openings 62 arranged in two lines in the Y direction. Accordingly, it is possible to dispose the openings 62 continuously in terms of a layout in the Y coordinates while separating the openings 62 from one another by using the common electrode 66.

Thus, the aperture array control module 180 and the blanking drive circuits 182 can individually control the respective blanking electrodes 64 corresponding to the openings 62 by supplying the signals for switching the portions of the electron beam between the on-state and the off-state to the respective blanking electrodes 64.

In the meantime, the portions of the electron beam passing through the openings 62 can be formed into the array beam with which an irradiation region on the specimen 10 is made continuous in the direction of the Y coordinates. In other words, by performing the scanning once with the array beam, a frame which extends in the X-axis direction with its frame width equivalent to the range of electron beam irradiation being continuous in the Y coordinates can be defined as the irradiatable region with the array beam.

Here, the aperture array device 60 has been described as having the openings 62 arranged in the two lines in the Y direction. Instead, the aperture array device 60 may have the openings 62 arranged in three or more lines in the Y direction.

In the latter case as well, it is possible to dispose the openings 62 continuously in terms of the layout in the Y coordinates while separating the openings 62 from one another by using the common electrode 66. Thus, the column unit 120 can scan and perform exposure on the surface of the specimen 10 with the array beam for each frame.

In any case, in the aperture array device 60, the openings 62 are disposed in such a way as to be arranged in the Y direction within a region (called as an illuminated region), which has widths in the Y direction and in the X direction different from each other and is to be illuminated by the electron beam.

The exposure apparatus 100 performs the exposure on the line pattern on the specimen 10 by using the array beam, which is formed from the portions of the electron beam illuminating the illuminated region and passing through the openings 62. In order for the exposure apparatus 100 to achieve a processing capacity (throughput) of about 10 pieces per hour, the electron beam illuminating the aperture array device 60 preferably satisfies all of the following conditions 1, 2, and 3, for example.

Condition 1: A current value of the electron beam illuminating the aperture array device 60 is equal to or above 10 µA.

Condition 2: As for the size of the illuminated region on the aperture array device 60, a width in the longitudinal direction is about 4 mm, a width in the lateral direction is about 5 μm, and a ratio of the width in the longitudinal direction to the width in the lateral direction is about 800.

Condition 3: The electron beam to illuminate the aperture array device 60 has a uniform intensity equal to or below 5% in the illuminated region.

The conditions 1 and 2 are the conditions for allowing the exposure apparatus 100 to repeatedly scan the irradiatable region 200 shown in FIG. 2 about 10 times per hour, for example, while irradiating the specimen 10 at a predetermined amount of exposure determined on the basis of resist sensitivity.

As described later, these conditions correspond to conditions for allowing an exposure apparatus 300 equipped with a plurality of column units 120 to process about ten pieces of 300-mm-diameter specimens 10 per hour.

The condition 3 is the condition for causing beam current values of the respective portions of the electron beam included in the array beam to substantially coincide with one another.

If there is a difference in beam current between the respective portions of the electron beam included in the array beam, then a moving velocity of the stage unit 110 has to be slowed down in conformity to the electron beam having a lower beam current value in order to provide the predetermined amount of exposure (an amount of electric charges) onto the specimen 10 by using the respective portions of the electron beam while performing the scanning by use of the entire array beam.

In other words, when the current value of the entire array beam is fixed, it is desirable to align the beam current values of the respective portions of the electron beam constituting the array beam with one another in order to maximize the processing capacity of the exposure apparatus 100.

Figure 4A:
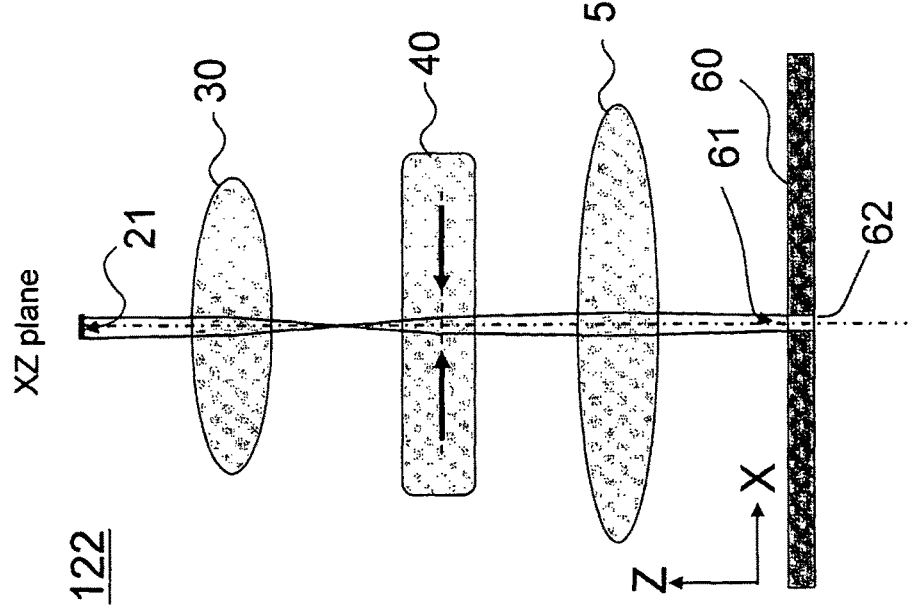
FIG. 4A is a diagram showing an electron beam path in a YZ-plane direction of a formation module of FIG. 1.
Figure 4B:
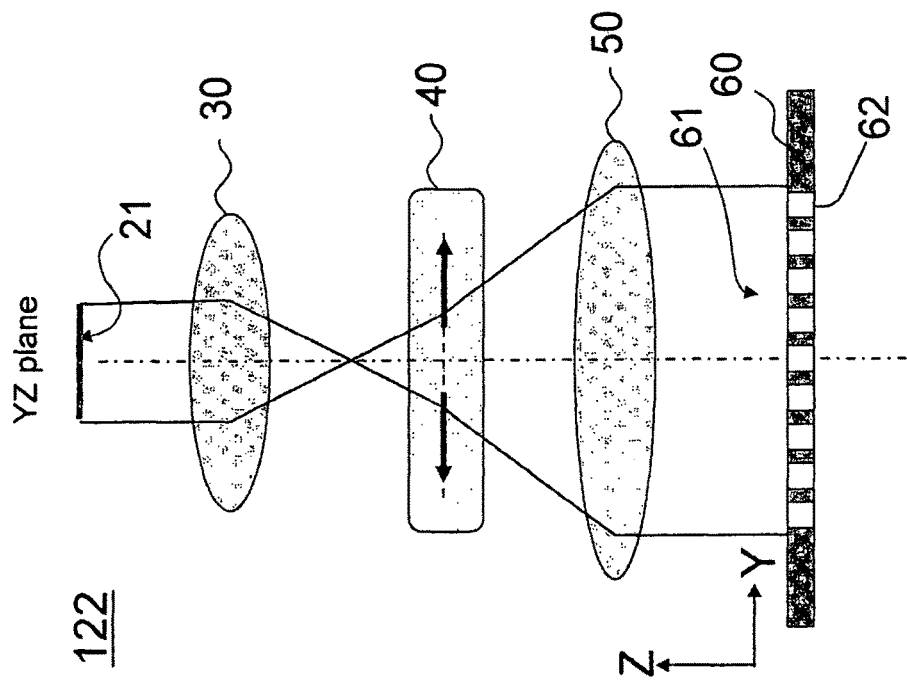
FIG. 4B is a diagram showing a configuration example and an electron beam path in an XZ-plane direction of the formation module of FIG. 1.

FIGS. 4A and 4B show the formation module 122 in the column unit 120 of this embodiment to form the portions of the electron beam with different irradiation positions, as well as an outline of an electron beam path therein. The constituents in FIGS. 4A and 4B which are the same as the constituents of the exposure apparatus 100 shown in FIG. 1 are denoted by the same reference signs.

FIG. 4A shows the formation module 122 in a YZ-plane defined by the −Z direction being the traveling direction of the electron beam and the Y direction being the longitudinal direction of the cross-section of the electron beam. Meanwhile, FIG. 4B shows the formation module 122 in an XZ plane defined by the −Z direction being the traveling direction of the electron beam and the X direction being the lateral direction of the cross-section of the electron beam.

The formation module 122 includes an emission region 21, the electron source-side illumination lens 30, the beam cross-section deformation device 40, the aperture array-side illumination lens 50, the aperture array device 60, an illuminated region 61, and the like which are arranged along the traveling direction of the electron beam.

Here, the emission region 21 is a region which can be treated as a region from which the electron source 20 emits the electron beam. The emission region 21 represents a region which is usually called crossover. Of the emission region 21, a width in the Y direction being the longitudinal direction and a width in the X direction being the lateral direction orthogonal thereto are different from each other. A configuration example of the electron source 20 for forming the above-mentioned emission region 21 will be described later.

A chain dashed line extending in the −Z direction from the center of the emission region 21 represents the optical axis of the electron beam. Optical elements including the electron source-side illumination lens 30, the beam cross-section deformation device 40, the aperture array-side illumination lens 50, and the like are disposed while locating the optical axis indicated with the chain dashed line in the center.

Solid lines extending from two ends of the emission region 21 in the −Z direction schematically show the electron beam path of electrons from a point of emission in parallel to the optical axis to a point of arrival at the aperture array device 60.

Each of the electron source-side illumination lens 30 and the aperture array-side illumination lens 50 is axisymmetric electron lens. The electron beam emitted from the emission region 21 and having the cross-sectional shape of which the width in the longitudinal direction is different from the width in the lateral direction is converged with these axisymmetric electron lenses, thereby illuminating the aperture array device 60.

A total amount of the beam current emitted by the electron source 20 is in a range from about 150 μA to 200 μA, for example.

The formation module 122 converges part of this beam current by using the electron source-side illumination lens 30 and the aperture array-side illumination lens 50, thereby forming the electron beam which is emitted from the emission region 21 and illuminates the aperture array device 60.

The formation module 122 uses 5% to 7% of the total amount of the beam current emitted by the electron source 20 as the electron beam for illuminating the aperture array device 60. In this case, the value of the electron beam current which illuminates the aperture array device 60 is about 10 pA. Thus, the aforementioned condition 1 is satisfied.

For instance, the width in the longitudinal direction of the emission region 21 is about 300 μm and the width in the lateral direction thereof is about 6 μm. The ratio of the width in the longitudinal direction to the width in the lateral direction of the emission region 21 is about 50.

The electron source-side illumination lens 30 isotropically converges the electron beam emitted from the emission region 21. The cross-section of the electron beam has a substantially similar shape to the emission region 21 all the way to a point near a position where an image of the emission region 21 is focused with the electron source-side illumination lens 30, and the ratio of the width in the longitudinal direction to the width in the lateral direction of the cross-section of the electron beam is about 50.

The beam cross-section deformation device 40 is installed between the electron source-side illumination lens 30 and the aperture array-side illumination lens 50.

In the YZ plane illustrated in FIG. 4A, the beam cross-section deformation device 40 functions to further expand a spread angle of the electron beam passing through the beam cross-section deformation device 40 as indicated with arrows therein.

Meanwhile, in the XZ plane illustrated in FIG. 4B, the beam cross-section deformation device 40 functions to reduce a spread angle of the electron beam passing through the beam cross-section deformation device 40 as indicated with arrows therein.

In this way, the beam cross-section deformation device 40 further expands the width in the longitudinal direction of the cross-section of the electron beam and reduces the width in the lateral direction thereof. In other words, the ratio of the width in the longitudinal direction to the width in the lateral direction of the cross-section of the electron beam is further deformed anisotropically by the beam cross-section deformation device 40. The beam cross-section deformation device 40 deforms the cross-sectional shape of the electron beam into a shape which is longer and thinner than the shape of the emission region to emit the electron beam.

By appropriately setting an output intensity of the beam cross-section deformation device 40, the formation module 122 illuminates the aperture array device 60 with the electron beam having a beam cross-section with: a width in the longitudinal direction being about 4 mm; a width in the lateral direction being about 5 µm; and a ratio of the width in the longitudinal direction to the width in the lateral direction being about 800.

Thus, the aforementioned condition 2 is satisfied. In FIG. 4, the elongated region where the electron beam illuminates the aperture array device 60 is indicated as the illuminated region 61.

The intensity of the electron beam EB emitted from different positions of the emission region 21 may vary due to various factors including temperature distribution at the generation portion for the electrons, a variation in shape thereof, and the like.

If an optical system to focus the image of the emission region 21 directly on the aperture array device 60 is employed, then intensity distribution of the electron beam EB emitted from the emission region 21 is directly reflected in intensity distribution of the electron beam illuminating the illuminated region 61, whereby the intensity distribution of the electron beam in the illuminated region 61 does not become sufficiently uniform.

Hence, it is difficult to satisfy the aforementioned condition 3 in this case.

Accordingly, in this embodiment, the beam cross-section deformation device 40 is disposed at a position on which the image of the emission region 21 is focused by the electron source-side illumination lens 30.

In this case, the beam cross-section deformation device 40 changes the spread angle of the electron beam, which passes through points of the image of the emission region 21, at the position where the emission region 21 is focused.

Thus, the beam cross-section deformation device 40 can deform the cross-section of the electron beam after having passed through the beam cross-section deformation device 40 while barely affecting a focal position brought about by the axisymmetric electron beam lenses.

Moreover, in this embodiment, the illuminated region 61 on the aperture array device 60 is located at a position which is different from the position on which the emission region 21 is focused by using the electron source-side illumination lens 30 and the aperture array-side illumination lens 50 which are axisymmetric.

In this way, even when the beam cross-section deformation device 40 is inserted between the electron source-side illumination lens 30 and the aperture array-side illumination lens 50, the image of the emission region 21 is not directly focused on the illuminated region 61. Instead, the electron beam having passed through the different position from the position on which to focus the emission region 21 is expanded mainly in the direction of the long side by the beam cross-section deformation device 40 and is then superimposed to illuminate the illuminated region 61.

In other words, even when there is the variation in beam intensity in the emission from different positions in the emission region 21, the portion of the opening 62 located in the illuminated region 61 is illuminated with the electron beam subjected to averaging of the variation.

This turns out to improve uniformity of the beam intensity of the electron beam which illuminates the illuminated region 61 on the aperture array device 60. Thus, the aforementioned condition 3 is satisfied.

An embodiment of the electron source 20, the illumination lenses 30 and 50, and the beam cross-section deformation device 40 collectively constituting the formation module 122 will be described further in detail.

Figure 5:
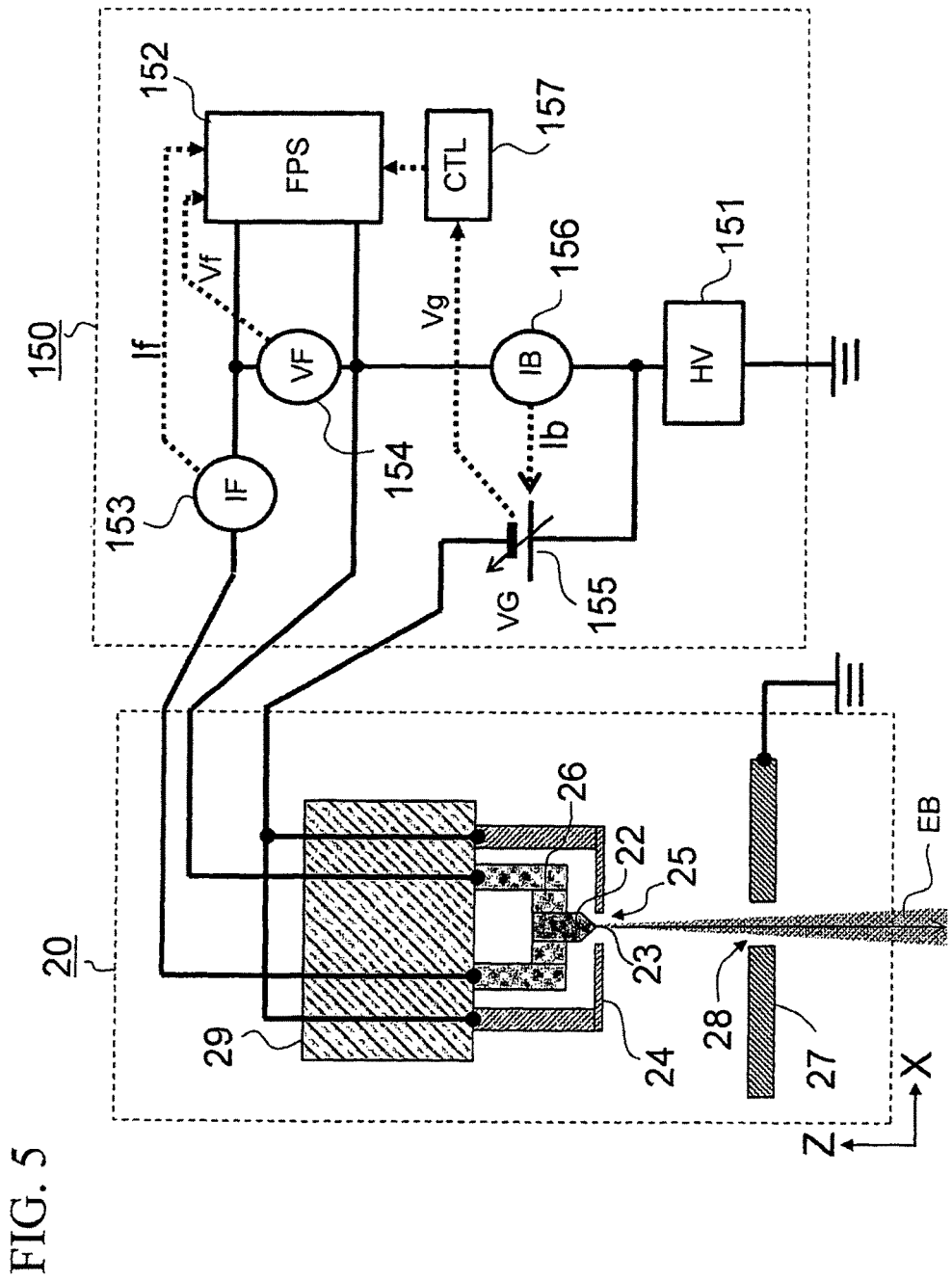
FIG. 5 is a diagram showing an electron source and an electron source control module of FIG. 1.

FIG. 5 shows a configuration example of the electron source 20 and the electron source control module 150 of this embodiment. The left half of FIG. 5 illustrates the configuration example of the electron source 20 while the right half thereof illustrates the configuration example of the electron source control module 150 which controls the electron source 20.

The electron source 20 includes a cathode unit 22, a generation portion 23 which generates electrons at a tip end of the cathode unit 22, and heating units 26 for causing the generation portion 23 to generate the electrons.

Among them, the heating units 26 heat the entire cathode unit 22 and thus cause the generation portion 23 to generate thermal electrons. A control electrode 24 provided with an opening 25 for allowing passage of the electrons is provided in the vicinity of the generation portion 23. This control electrode 24 controls the amount of the electron beam (the current value) which is generated at the generation portion 23 and passes through the opening 25.

These constituents of the electron source 20 are insulated from a grounding unit 27 by use of an insulation unit 29. The acceleration voltage for accelerating the electron beam is applied between the cathode unit 22 and the grounding unit 27.

The grounding unit 27 has an opening 28 for allowing passage of the electron beam. The opening 28 allows the passage of a portion of the electron beam out of the electron beam having passed through the opening 25 of the control electrode 24 and then accelerated toward the grounding unit 27, the portion having its radiation angle within a predetermined range.

Thus, the electron source 20 outputs the electron beam, which has passed through the opening 28 of the grounding unit 27, to the column unit 120 located downstream of the electron source 20.

The electron source control module 150 includes an acceleration voltage power source 151 to apply the acceleration voltage entirely to the cathode unit 22, the control electrode 24, and the heating units 26 which are insulated with the insulation unit 29. In the electron source control module 150, the entire circuitry except the acceleration voltage power source 151 is operated with the acceleration voltage outputted from the acceleration voltage power source 151. In this embodiment, the acceleration voltage can be set to 50 KV, for example.

A heating power source 152 is a power source to output a heating current to the heating units 26, which heat the cathode unit 22 of the electron source 20.

A heating current meter 153 constantly detects a heating current value If outputted from the heating power source 152.

Meanwhile, a heating voltage meter 154 constantly detects a voltage value Vf which is generated at two ends of the heating units 26 as a consequence of the output of the heating current from the heating power source 152.

The heating power source 152 may receive feedback of the values If and Vf, and control the heating current from the heating power source 152 on a steady basis and in such a way as to keep the current value If or a power consumption value Vf×If constant.

A control electrode power source 155 is a power source to output a control voltage Vg to the control electrode 24 of the electron source 20. The control electrode power source 155 constantly controls the control voltage Vg at the control electrode 24 such that a total amount of the current value of the electron beam being generated by the generation portion 23, passing through the opening 25 of the control electrode 24, and flowing to the ground side becomes constant.

The total amount of the current value of the electron beam can be detected with an ammeter 156, because the total amount of the current value of the electron beam is almost equal to a current value Ib of a current that the acceleration voltage power source 151 feeds to the portion to apply the acceleration voltage.

A control circuit 157 is a circuit which controls the heating power source 152 based on the control voltage Vg of the control electrode power source 155.

The control circuit 157 regularly reads the output voltage value Vg from the control electrode power source 155, and regularly controls the output of the heating power source 152.

After a passage of certain time from the start of operation of the electron source 20, the output voltage value Vg from the control electrode power source 155 for keeping the detection value Ib by the beam ammeter 156 constant deviates from its initial value due to a change in shape of the cathode unit 22 attributed to wear, and the like.

In this case, even when the detection value Ib by the beam ammeter 156, i.e., the total amount of the current value of the electron beam is successfully controlled at the constant level, there is still the chance of a change in spatial intensity distribution of the electron beam downstream of the electron source 20 from the viewpoint of the column unit 120.

For this reason, the control circuit 157 may regularly control the output of the heating power source 152 such that the output voltage value from the control electrode power source 155 does not deviate significantly from the initial value.

According to the electron source 20 and the electron source control module 150 of the configuration example shown in FIG. 5, the electron source 20 outputs the electron beam EB to the column unit 120 located downstream of the electron source 20, the electron beam EB being accelerated to the predetermined acceleration voltage such as 50 KV and also having the stable current value and the stable intensity distribution in terms of time.

FIGS. 6A to 6C show a configuration example of the cathode unit 22, the generation portion 23, and the heating units 26 in the electron source 20. FIG. 6A is a front view in the XZ plane showing the cathode unit 22, the generation portion 23, and part of the heating units 26. FIG. 6B is a perspective view showing the cathode unit 22, the generation portion 23, and part of the heating units 26. Moreover, FIG. 6C is a bottom view of the cathode unit 22, the generation portion 23, and the heating units 26 viewed in the traveling direction of the electron beam.

The cathode unit 22 employs a material prepared by forming a lanthanum hexaboride ($LaB_6$) crystal into a columnar shape, for example. A tip end side of the columnar cathode unit 22 is processed into a wedge shape and an apex of the wedge constitutes the generation portion 23. As shown in FIG. 6C, the generation portion 23 is formed into a rectangular shape having a width in the longitudinal direction and a width in the lateral direction orthogonal to the longitudinal direction, which are different from each other.

When the cathode unit 22 having the above-described shape is heated by means of the heating units 26, the generation portion 23 having the width in the longitudinal direction and the width in the lateral direction orthogonal to the longitudinal direction being different from each other, generates thermal electrons from a surface thereof, for example. The generated electrons are controlled with the control electrode 24, accelerated by the acceleration voltage applied between the cathode unit 22 and the grounding unit 27, caused to pass through the opening 28 of the grounding unit 27, and emitted from the electron source 20.

The diameter of the column of the cathode unit 22 is preferably in a range from 250 μm to 500 μm, for example, so as to raise the temperature of the generation portion 23 at the tip end of the cathode unit 22 substantially uniformly when heated through the heating units 26, thereby causing the generation portion 23 to generate the electrons substantially evenly from its surface. For this reason, the width of the long side of the generation portion 23 is set in a range from 250 μm to 500 μm, for example.

The width of the short side of the generation portion 23 is set to such a condition that enables the processing of the tip end of the cathode unit 22 into the sharp wedge shape without causing cracks or flakes. In the meantime, the width of the short side of the generation portion 23 is desirably set to such a width enough for maintaining the shape of the generation portion 23 for a predetermined period even if the tip end of the cathode unit 22 wears as a consequence of the emission of electrons. The width of the short side of the generation portion 23 is set in a range from 5 μm to 50 μm, for example.

The way how long the width of the long side and the width of the short side of the generation portion 23 are set involves design matters which are selectable within the ranges of these restriction conditions. From the aforementioned conditions on the width of the long side and the width of the short side of the generation portion 23, the generation portion 23 has the substantially rectangular shape with a ratio of the width of the long side to the width of the short side thereof is set in a range from 5 to 50 inclusive.

The heating units 26 mechanically support the cathode unit 22 by nipping side surfaces of the column from two sides. The heating units 26 generate heat when the current is fed between the right and left heating units 26 nipping the cathode unit 22, and the cathode unit 22 is thus heated.

Here, two positions on a side surface of the cathode unit 22 having the columnar shape may be cut out so as to be brought into surface contact with the heating units 26. In this case, the heating units 26 may nip the cathode unit 22 in the short-side direction of the generation portion 23. Alternatively, the heating units 26 may nip the cathode unit 22 in the long-side direction of the generation portion 23 instead.

Note that FIGS. 6A to 6C show the example in which the heating units 26 mechanically support the cathode unit 22 by nipping the cathode unit 22 in the short-side direction of the generation portion 23.

Figure 7:
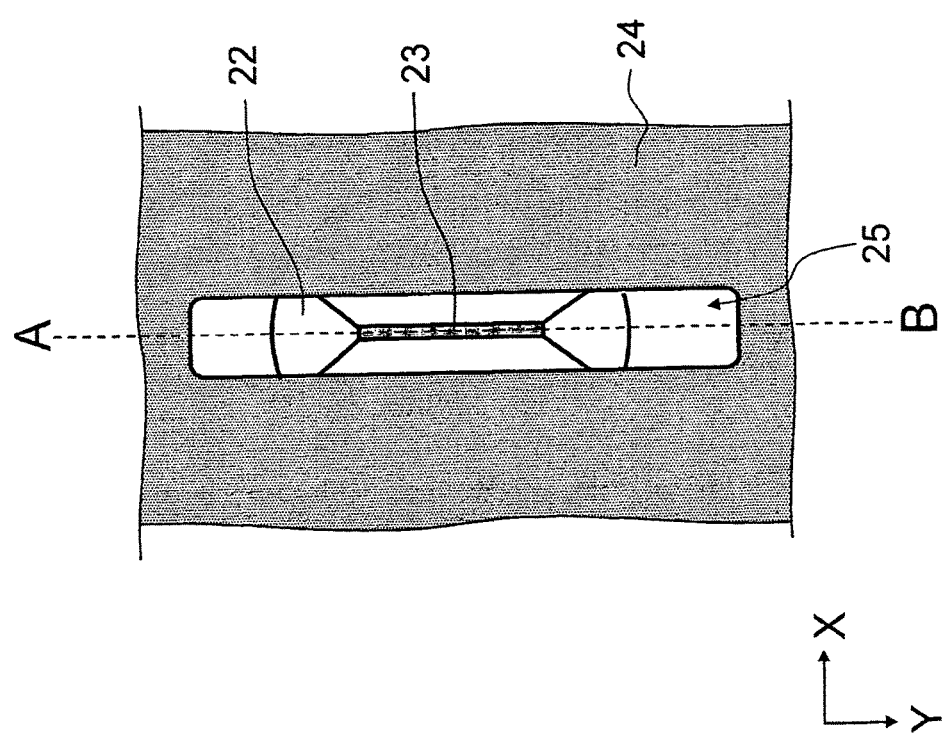
FIG. 7 is a bottom view of a control electrode of FIG. 5.

FIG. 7 is a bottom view of the configuration example of the cathode unit 22 and the control electrode 24 of this embodiment, which is viewed from the direction of the emission of the electron beam.

While the generation portion 23 at the tip end of the cathode unit 22 has the substantially rectangular shape of which the width in the longitudinal direction and the width in the lateral direction orthogonal thereto are different from each other, the control electrode 24 also has the opening 25 having a substantially rectangular shape in response thereto, of which a width in a longitudinal direction and a width in a lateral direction orthogonal thereto are different from each other.

The longitudinal direction of the opening 25 is substantially parallel to the longitudinal direction of the generation portion 23.

A dashed line AB is a line which bisects the width in the lateral direction of the opening 25 of the control electrode 24, the bisector being substantially parallel to the longitudinal direction of the opening 25 of the control electrode 24 and the longitudinal direction of the generation portion 23, respectively. The dashed line AB is also a line which bisects the width in the lateral direction of the generation portion 23.

When viewed from the direction of the emission of the electron beam as illustrated in FIG. 7, these bisectors substantially coincide with each other and the opening 25 of the control electrode 24 is installed while being aligned with the generation portion 23.

In FIG. 7, the electrons generated from the generation portion 23 pass through the opening 25 of the control electrode 24 while being accelerated toward the front of the paper.

The control electrode power source 155 (see FIG. 5) applies the control voltage Vg to the control electrode 24. The control voltage Vg to be applied to the control electrode 24 is different from an electric potential obtained by internally dividing a potential difference between the generation portion 23 and the grounding unit 27 depending on the position of the control electrode 24.

As shown in FIG. 7, a distance between each side in the longitudinal direction of the opening 25 and the generation portion 23 is made shorter than a distance between each side in the lateral direction of the opening 25 and the generation portion 23.

Accordingly, when the electron beam passes through the opening 25, the electron beam receives a stronger electrostatic force from portions of the control electrode 24 which form the sides in the longitudinal direction of the opening 25, because the electron beam passes through a region of the opening 25 close to the sides in the longitudinal direction of the opening 25.

On the other hand, since the electron beam passes through a region of the opening 25 away from the sides in the lateral direction of the opening 25, the electron beam receives a weaker electrostatic force from portions of the control electrode 24 which form the sides in the lateral direction of the opening 25. The electron beam thus receives the electrostatic force from the control electrode 24, which is asymmetric in terms of the longitudinal direction of the beam cross-section and the lateral direction orthogonal thereto.

Accordingly, the electron beam is emitted from the electron source 20 after passing through the opening 25 while still retaining the state of anisotropy intrinsic to the generation portion 23, i.e., the cross-section having the width in the longitudinal direction and the width in the lateral direction orthogonal thereto which are different from each other.

In other words, in the column unit 120 located downstream of the electron source 20, the electron beam emitted from the electron source 20 behaves as the electron beam EB emitted from the emission region 21 (see FIG. 4), which has the width in the longitudinal direction and the width in the lateral direction orthogonal thereto being different from each other.

The width in the longitudinal direction and the width in the lateral direction orthogonal thereto of the emission region 21 depend on the shape of the generation portion 23 having the substantially rectangular shape, and on the shape of the opening 25 of the control electrode 24.

Figure 8A:
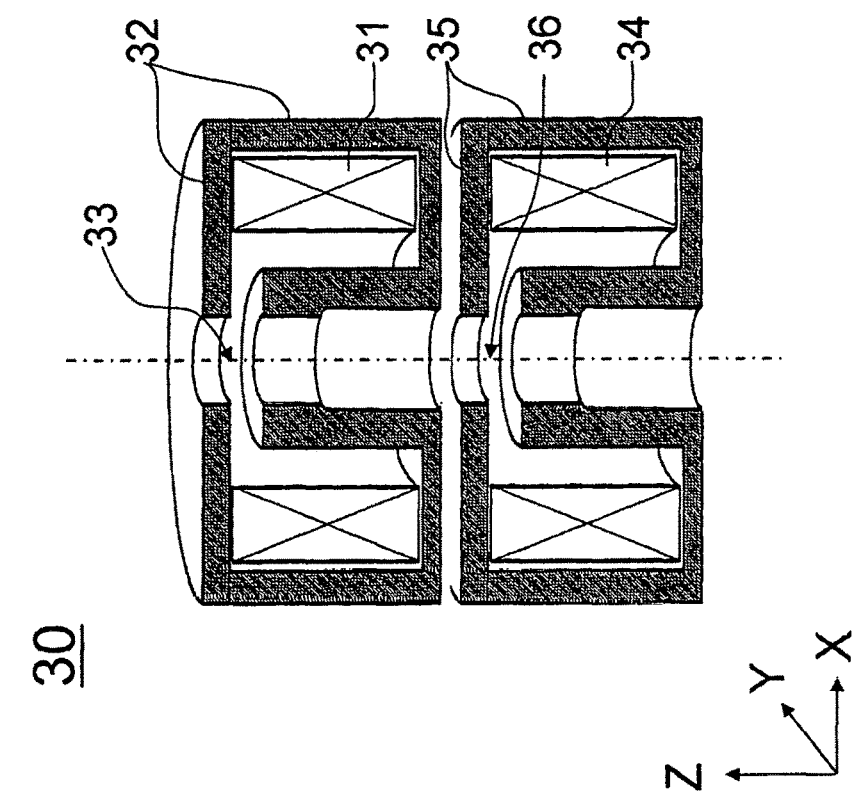
FIG. 8A is a perspective view of a cross-section of an electron source-side illumination lens of FIG. 1.
Figure 8B:
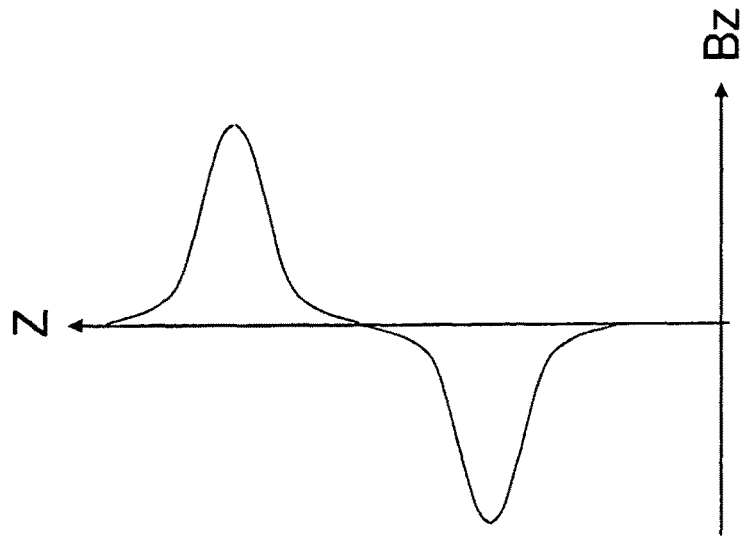
FIG. 8B is a graph showing magnetic field intensity on an optical axis of the electron source-side illumination lens.

FIG. 8A is a cross-sectional view showing a configuration example of the electron source-side illumination lens 30 of this embodiment, and FIG. 8B is a graph showing a magnetic field intensity on the optical axis of the electron source-side illumination lens 30 of this embodiment. Note that the aperture array-side illumination lens 50 also has a similar configuration to that in FIG. 8A, and exhibits a similar magnetic field to that in FIG. 8B. A chain dashed line in FIG. 8A is the optical axis of the lens substantially parallel to the Z axis.

In the configuration example of FIG. 8A, the electron source-side illumination lens 30 is the electron beam lens which includes coils 31 and 34, magnetic bodies 32 and 35, and gaps 33 and 36, all of which have axisymmetric shapes with respect to the optical axis.

When the lens control module 160 (see FIG. 1) feeds the current to the coils 31 and 34, each of the magnetic bodies 32 and 35 opposed to the coils 31 and 34 with the gaps 33 and 36 in between is magnetically excited and transformed into either the N pole or the S pole. Since the magnetic field is generated at each of the gaps 33 and 36 between the N pole and the S pole, a local magnetic field in the Z direction also comes into being on the optical axis near each of the gaps 33 and 36.

The graph of FIG. 8B illustrates distribution of magnetic fields Bz in the Z direction (the horizontal axis) excited on the optical axis (the Z axis) being the vertical axis of the graph. The electron source-side illumination lens 30 exhibits a lens effect attributed to the local magnetic fields Bz shown in FIG. 8B, thereby converging the electron beam which travels in the direction of the optical axis.

The electron source-side illumination lens 30 brings about structures of two different magnetic fields Bz located on the Z axis, which correspond to the gaps 33 and 36. A peak height of the structure of each magnetic field Bz is determined depending on the required lens strength and has a value in a range of 0.1 T to 0.3 T, for example.

As for the electron source-side illumination lens 30, the direction of the current to be fed to the coil 31 on an upper side (the +Z side) is set opposite to the direction of the current to be fed to the coil 34 on a lower side (the −Z side), thereby setting the polarity of the structure of the magnetic field Bz on the upper side opposite to the polarity of the structure of the magnetic field Bz on the lower side.

In the electron source-side illumination lens 30, values of the currents to the coils 31 and 34 may be set to appropriate magnitudes with the mutually opposite polarities, thereby establishing such a setting that applies the lens effect to the electron beam passing through the lens while avoiding rotation of the electron beam about the Z axis at the same time.

In other words, the lens magnetic fields Bz on the Z axis may be set such that an integration value thereof becomes zero as a consequence of the structures of the upper and lower magnetic fields Bz offsetting each other.

Thus, the electron source-side illumination lens 30 is formed as a rotation-free combination lens, which does not rotate the longitudinal direction and the lateral direction of the cross-section of the electron beam passing through the lens about the Z axis. In the meantime, the aperture array-side illumination lens 50 adopts the same configuration and is formed as a rotation-free combination lens.

In this case, the electron source 20, the beam cross-section deformation device 40, and the aperture array device 60 in the formation module 122 can be arranged such that the cross-section of the electron beam at each device retains substantially the same longitudinal direction.

Such an arrangement is possible because the longitudinal direction of the cross-section of the electron beam and the lateral direction orthogonal thereto are not changed by the rotation-less combination lenses 30 and 50 sandwiched between the electron source 20 and the beam cross-section deformation device 40 and between the beam cross-section deformation device 40 and the aperture array device 60, respectively.

The use of the rotation-free combination lenses in the lenses 30 and 50 has an advantage of simplifying layout relations among the electron source 20, the beam cross-section deformation device 40, and the aperture array device 60 which are the constituents of the formation module 122 and thus simplifying the structure of the formation module 122.

Figure 9B:
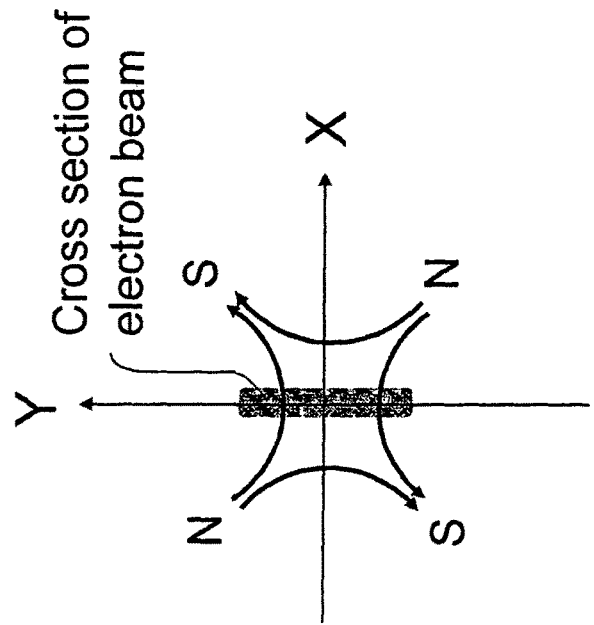
FIG. 9B is a diagram showing directions of a magnetic field in the XY plane caused by the beam cross-section deformation device.
Figure 9A:
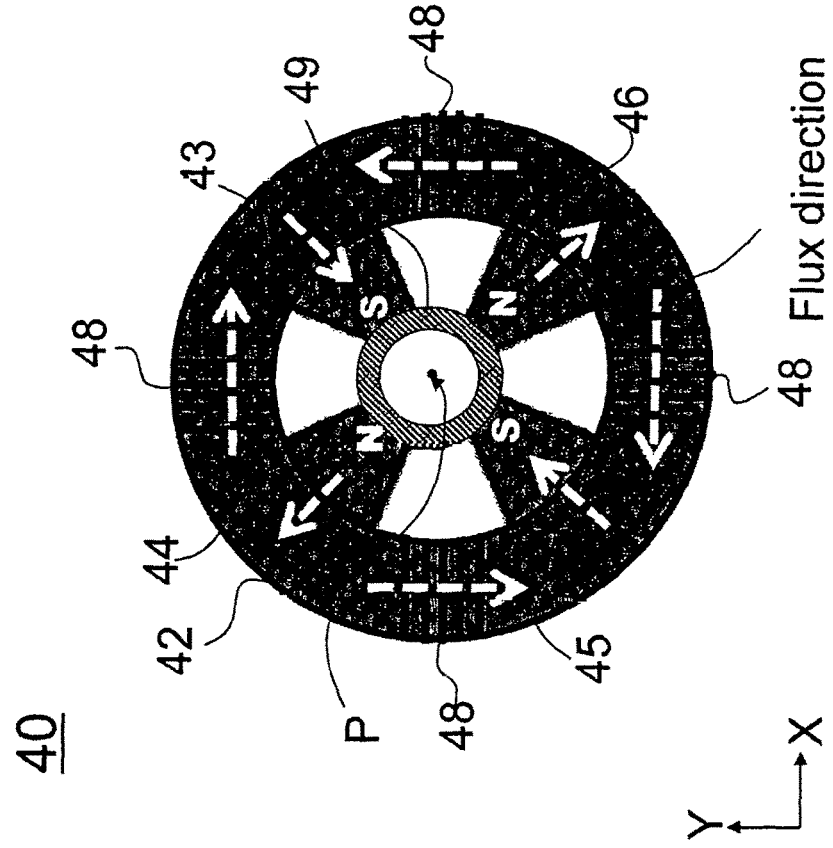
FIG. 9A is a plan view of a beam cross-section deformation device of FIG. 1.

FIG. 9A is a plan view of the beam cross-section deformation device 40 of FIG. 1.

As shown in FIG. 9A, the beam cross-section deformation device 40 can be the quadrupole, which deforms the beam cross-section by using the magnetic field. Instead, the beam cross-section deformation device 40 may be a quadrupole, which deforms the beam cross-section by using an electric field.

The beam cross-section deformation device 40 of FIG. 9A includes a magnetic body ring 42 disposed in the XY plane perpendicular to the Z direction being the traveling direction of the electron beam. The electron beam travels in the center P of the magnetic body ring 42, and thus passes through the beam cross-section deformation device 40 in a perpendicular direction to the paper surface of FIG. 9A.

The magnetic body ring 42 is provided with at least four bulging portions 43, 44, 45, and 46 bulging toward the center P of the ring. These bulging portions 43, 44, 45, and 46 are also made of the magnetic body. The bulging portions 43, 44, 45, and 46 are oriented in (X+Y), (−X+Y), (−X−Y), and (X−Y) directions in the XY plane, respectively.

In the meantime, excitation coils 48 are wound around at four positions each located between the adjacent bulging portions of the magnetic body ring 42.

The magnetic body ring 42, the bulging portions 43, 44, 45, and 46, and the excitation coils 48 are disposed in the atmosphere. A vacuum partition 49 is a cylindrical partition extending in the Z axis direction, which separates the atmosphere from a vacuum in which the electron beam passes through.

The deformation device control module 170 (see FIG. 1) feeds excitation currents in the mutually opposite directions to the excitation coils 48 adjacent to each other.

Arrows in dashed lines shown in the magnetic body ring 42, and the bulging portions 43, 44, 45, and 46 in FIG. 9A indicate directions of magnetic fluxes excited inside the magnetic body by the currents fed to the excitation coils 48. These magnetic fluxes generate the N poles and the S poles at ends of the bulging portions of the magnetic body as shown in FIG. 9A, for example.

FIG. 9B shows a magnetic field corresponding to the quadrupole, which are generated at a portion in the center of the ring where the electron beam passes through, and by means of the magnetic poles generated at the bulging portions of the magnetic body. Arrows in FIG. 9B show directions of respective lines of magnetic force. The intensity of a magnetic field becomes stronger as a measurement point of the magnetic field is located farther from the center of the ring and closer to any of the bulging portions 43, 44, 45, and 46.

A force from the magnetic field acting on the electron beam, which travels in the −Z direction being perpendicular to the paper surface, acts in the +Y direction on part of the beam passing in the vicinity of a portion of the cross-section on the +Y side in FIG. 9B, and acts in the −Y direction on part of the beam passing in the vicinity of a portion of the cross-section on the −Y side in FIG. 9B. In other words, the magnetic field in FIG. 9B acts on the electron beam in such a way as to further expand the longitudinal direction of the beam cross-section.

On the other hand, in terms of the lateral direction of the electron beam, the beam passes in the vicinity of the center of the ring and receives a smaller force from the magnetic field. Accordingly, the magnetic field in FIG. 9B acts on the electron beam in such a way as to slightly compress the lateral direction of the beam cross-section.

The deformation device control module 170 sets the magnetic field of the beam cross-section deformation device 40 shown in FIG. 9B through the deformation device drive circuit 172.

Even if the ratio of the width in the longitudinal direction to the width in the lateral direction of the cross-section of the electron beam is in the range from 5 to 50 inclusive before the passage through the beam cross-section deformation device 40, the electron beam is deformed into the beam having a more elongated cross-sectional shape on the aperture array device 60 as a consequence of the passage through the beam cross-section deformation device 40.

By appropriately setting the intensity of the magnetic field of the beam cross-section deformation device 40, the ratio of the width in the longitudinal direction to the width in the lateral direction of the illuminated region 61 on the aperture array device 60 is set in a range from 500 to 1000 inclusive.

Now, referring to FIG. 10, a description will be given below of a simulation example of intensity distribution of the electron beam to illuminate the aperture array device 60 in the formation module 122 of this embodiment.

The generation portion 23 having the ratio of the width of the long side to the width of the short side equal to about 50 is set at the tip end of the cathode unit 22 of the electron source 20. Then, beam paths of the electrons being emitted from points at the generation portion 23 and eventually illuminating the aperture array device 60 were tracked. FIG. 10 shows a result thus obtained.

Here, the acceleration voltage was set to 50 KV. Meanwhile, an output of the beam cross-section deformation device 40 was set such that the length in the longitudinal direction of the illuminated region 61 on the aperture array device 60 becomes equal to about 4 mm.

Figure 10:
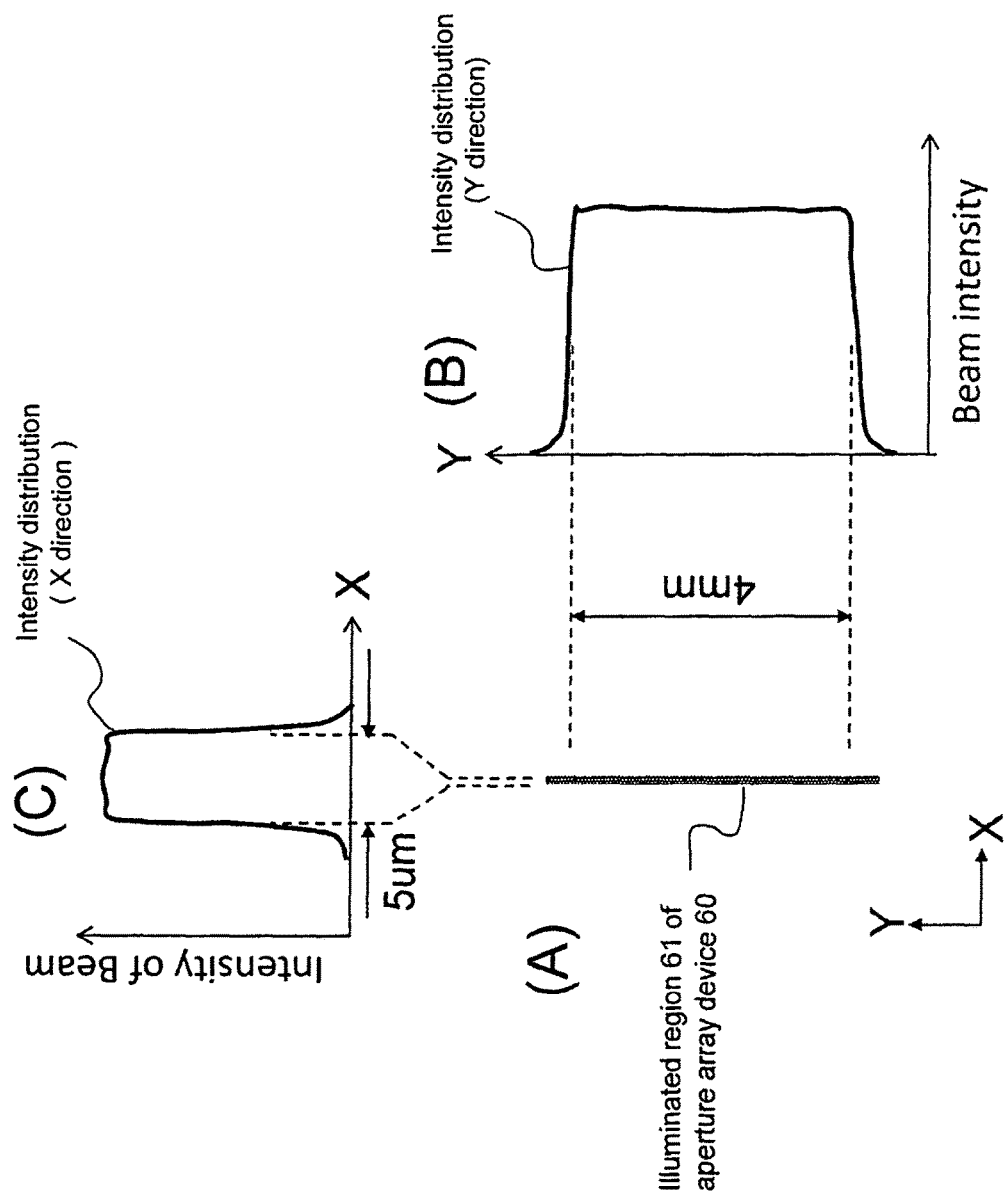
FIG. 10 includes diagrams showing an illuminated region 61 of the aperture array device 60 of FIG. 1 and beam intensity distribution thereof.

A region denoted by reference sign 61 at the center of FIG. 10 represents the illuminated region 61 on the aperture array device 60 illuminated by the electron beam, which is obtained by the simulation.

A graph on the right in FIG. 10 shows the intensity distribution (the horizontal axis) of the beam along the longitudinal direction (the Y direction; the vertical axis). Meanwhile, a graph on the top in FIG. 10 shows the intensity distribution (the vertical axis) which is enlarged in terms of the lateral direction (the X direction; the horizontal axis).

FIG. 10 demonstrates that the electron beam can illuminate a range of about 4 mm in the longitudinal direction and about 5 μm in the lateral direction on the aperture array device 60. In other words, FIG. 10 demonstrates that the aperture array device 60 is illuminated with the electron beam having the ratio of the width in the longitudinal direction to the width in the lateral direction of the beam cross-section equal to about 800.

Moreover, the graphs in FIG. 10 show that the intensity distribution of the electron beam illuminating the illuminated region 61 on the aperture array device 60 is substantially uniform with an allowance of 5% or below.

Furthermore, the current value of the electron beam illuminating the aperture array device 60 turned out to be around 10 μA on the whole.

As shown in FIG. 10, as a result of the simulation, it is confirmed that the formation module 122 of this embodiment can illuminate the aperture array device 60 with the electron beam which satisfies all the above-mentioned conditions, namely, the condition 1, the condition 2, and the condition 3.

In the aperture array device 60, the openings 62 for cutting out the portions of the electron beam are located in a region of about 3.6 mm in the longitudinal direction (the Y direction) and in a range of about 4 μm in the lateral direction (the X direction).

The exposure apparatus 100 forms the array beam by using the portions of the electron beam having passed through the openings 62, out of the electron beam to illuminate the illuminated region 61. The array beam passes through the reduction projection lens 80 located between the aperture array device 60 and the specimen 10, whereby the beam cross-section thereof is reduced by about 1/60.

Thus, the column unit 120 forms the array beam including the portions of the electron beam arranged in the Y direction on the specimen 10, with the entire width of the portions of the electron beam being equal to about 60 μm.

Second Embodiment

The exposure apparatus 100 according to the first embodiment has been described above as a single-column-type electron beam exposure apparatus including the single column unit 120. However, the present invention is not limited to this configuration, and an exposure apparatus may include a plurality of column units 120.

A description will be given below of such an exposure apparatus 300 according to a second embodiment, which includes a plurality of column units 120, using FIG. 11.

Figure 11:
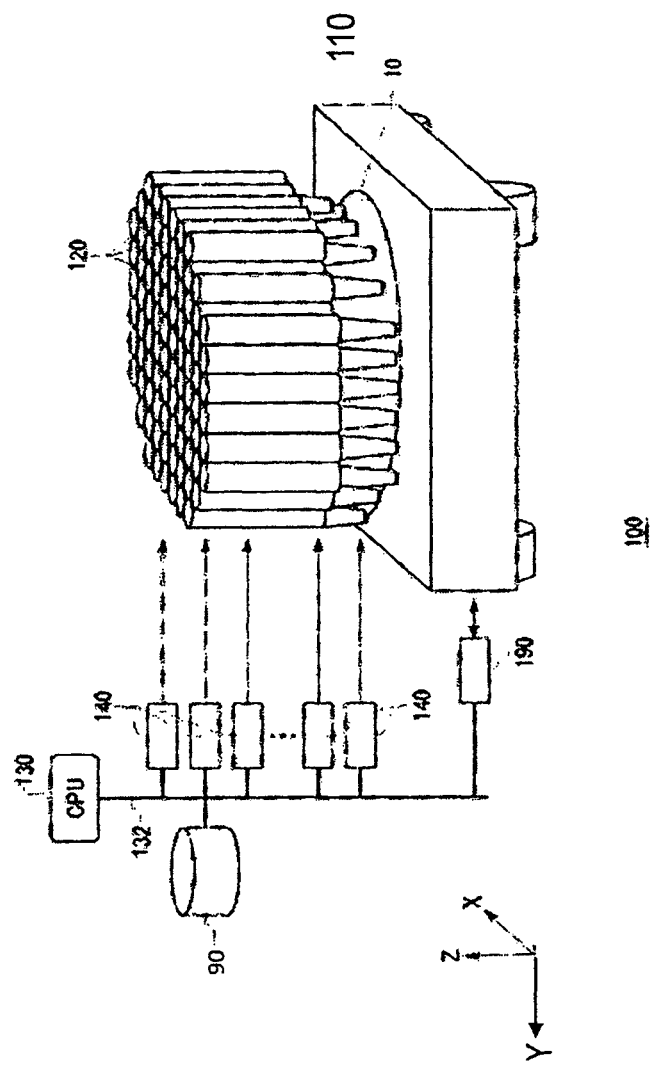
FIG. 11 is a diagram showing an exposure apparatus 300 according to a second embodiment.

FIG. 11 illustrates a modified example of the exposure apparatus 100 of the present invention. In FIG. 11, operations which are substantially the same as the operations of the exposure apparatus 100 of the embodiment shown in FIG. 1 will be denoted by the same reference signs and descriptions thereof will be omitted.

As shown in FIG. 11, the exposure apparatus 300 of this embodiment includes a plurality of column units 120 and a plurality of exposure control units 140.

If the exposure apparatus 300 is configured to scan irradiation positions with the array beam by moving the stage unit 110, then the exposure control units 140 do not have to include the scanning control modules 190 one by one.

In the example of FIG. 11, the exposure apparatus 300 includes one stage unit 110, eighty-eight column units 120, one CPU 130, eighty-eight exposure control units 140 without scanning control modules 190, and one scanning control module 190.

The eighty-eight column units 120 may be arranged at a pitch of 30 mm in the XY plane, opposed to the specimen 10 with a diameter of about 300 mm mounted on the stage unit 110.

Each of the column units 120 is connected to the corresponding exposure control unit 140. Based on control signals from the exposure control units 140, the array beam is emitted from each of the column units 120. Then, as described with reference to FIG. 2, the irradiatable region 200 corresponding to each column unit 120 is exposed on the frame basis.

Specifically, the scanning control module 190 moves one specimen 10 relative to the plurality of column units 120 by controlling the stage unit 110 designed to mount and move the specimen 10. Hence, the scanning control module 190 causes the column units 120 to irradiate the specimen 10 with the electron beams in parallel.

The electron beam exposure apparatus 300 can perform the exposure in parallel by using the column units 120. Accordingly, the electron beam exposure apparatus 300 can perform exposure to the entire specimen 10 by using a time period required by each column unit 120 for performing the exposure on the irradiatable region 200 allocated thereto for the exposure.

In this way, the electron beam exposure apparatus 300 can drastically enhance the exposure throughput. Moreover, even when the specimen 10 is a semiconductor wafer or the like having a large diameter in excess of 300 mm, the electron beam exposure apparatus 300 can avoid a significant drop in throughput by increasing the number of column units 120 in response to the diameter of the specimen 10.

Now, a result of an investigation of the throughput of the electron beam exposure apparatus 300 provided with the eighty-eight column units 120 will be described below.

Each of the column units 120 includes the formation module 122 which illuminates the aperture array device 60 with the electron beam in an elongated shape. Each formation module 122 is assumed to satisfy the condition 1, the condition 2, and the condition 3 concerning the illuminated region 61 on the aperture array device 60.

Meanwhile, each column unit 120 reduces the portions of the electron beam cut out by the openings 62 at the rate of 1/60, thereby forming the array beam which can be switched between the on-state and the off-state individually on the surface of the specimen 10.

The irradiatable region 200 to be allocated to each column unit 120 for the exposure has a size of 30×30 mm. Meanwhile, a frame width fw (see FIG. 2) of the entire array beam is equal to 60 m. In other words, the exposure apparatus 300 is configured to perform the scanning and exposure by moving the stage unit 110, while dividing the irradiatable region 200 into frames each having a width of 60 m.

Figure 12:
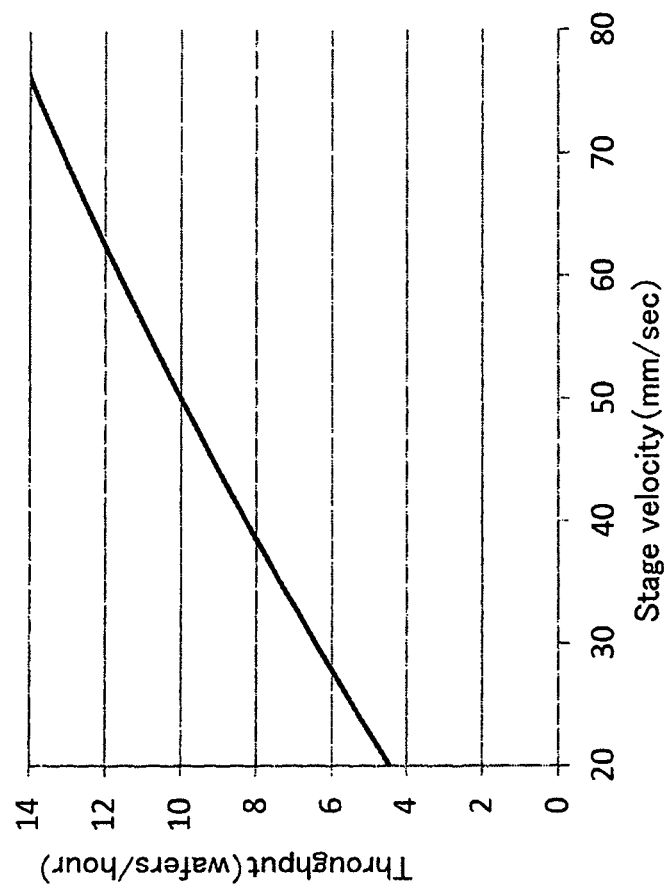
FIG. 12 is a graph showing a relation between a scanning velocity (mm/sec) using a stage and exposure throughput (wafers/hour) of the exposure apparatus 300 of FIG. 11.

FIG. 12 is a graph showing a relation between a scanning velocity using the stage and exposure throughput of the exposure apparatus 300 of FIG. 11. Here, the horizontal axis indicates a stage velocity (mm/sec). The vertical axis indicates the number of pieces of the 300-mm-diameter specimens 10 processable per hour (wafers/hour).

Meanwhile, the exposure throughput on the vertical axis is obtained by including a sixty-second overhead for each specimen 10. The overhead is mainly attributed to an alignment operation of the array beam with the line pattern on the specimen 10, and the like.

The stage velocity V for scanning the frames depends on a current density J of each portion of the electron beam constituting the array beam, a beam width d in a stage scanning direction, and a resist sensitivity D.

Based on the condition 1 and the condition 2 of the electron beam illuminating the illuminated region 61 on the aperture array device 60 and the reduction ratio of 1/60, the electron density J of each portion of the electron beam constituting the array beam and irradiating the specimen 10, the portion being formed as a consequence of the passage through the corresponding opening 62, is obtained by the following formula:

$$J=(10\ \mu A/(4\ mm\times 5\ \mu m))\times 60\times 60=180\ A/cm^2$$

In order to form a pattern on a resist coated on the surface of the specimen 10, the resist needs to be subjected to the exposure, in an amount determined by the resist sensitivity D within a period of time required for the stage to scan a distance of 12 nm, for example, which corresponds to the beam width d in the stage scanning direction.

When the current density J of the array beam is 180 A/cm$^2$, the relation between the resist sensitivity D and the stage velocity V is as shown below.

TABLE 1

| Resist Sensitivity D ($\mu C/cm^2$) | Stage Velocity V (mm/sec) |
|---|---|
| 40 $\mu C/cm^2$ | 54 mm/sec |
| 50 $\mu C/cm^2$ | 43 mm/sec |
| 60 $\mu C/cm^2$ | 36 mm/sec |

Based on the relation between tne resist sensitivity D and the stage velocity V (Table 1), and on the graph of FIG. 12 concerning the stage velocity V and the throughput, results of the throughput for processing the 300-mm-diameter specimens 10 (wafers/hour) turn out to be 10.6 wafers/hour, 8.7 wafers/hour, and 7.5 wafers/hour regarding the resist sensitivity D of 40 $\mu C/cm^2$, 50 $\mu C/cm^2$, and 60 $\mu C/cm^2$, respectively.

The throughput depends on the overall width fw of the array beam on the specimen 10, because the width fw of the array beam dictates a total travel distance for scanning by moving the stage in order to perform the exposure on the irradiatable region 200, and the number of times of returns at ends of the frames. It is desirable to increase the width fw in order to gain the throughput. Such an increase corresponds to an increase in width in the longitudinal direction of the illuminated region 61 on the aperture array device 60.

In the meantime, the current density J of each of the portions of the electron beam constituting the array beam needs to be increased in order to gain the throughput.

To increase the current density J, it is desirable to make the electron beam emitted from the emission region 21 of the electron source 20 illuminate all the openings 62 on the aperture array device 60 while illuminating marginal portions other than the openings 62 as little as possible.

This corresponds to a configuration to reduce the width in the lateral direction of the illuminated region 61 on the aperture array device 60 as small as an arrangement width of the openings 62 in the X direction.

In light of the throughput, it is desirable to make the ratio of the width in the longitudinal direction to the width in the lateral direction of the illuminated region 61 on the aperture array device 60 as large as possible by increasing the width in the longitudinal direction while reducing the width in the lateral direction.

In the meantime, this ratio is subject to restrictions because of the aim of increasing the total amount of the current value of the electron beam to illuminate the illuminated region 61 and achieving uniform intensity of the electron beam to illuminate the illuminated region 61.

Each of the exposure apparatus, 100 and the exposure apparatus 300 of the embodiments has the ratio of the width in the longitudinal direction to the width in the lateral direction of the illuminated region 61 on the aperture array device 60 equal to about 800, for example, and has the current density J of each of the portions of the electron beam constituting the array beam equal to 180 A/cm$^2$ In the exposure apparatus 300 provided with the plurality of column units, the resist sensitivity D equal to 40 $\mu C/cm^2$ corresponds to the condition with which about 10 pieces of the 300-mm-diameter specimens 10 are processable in every hour.

The present invention has been described above with reference to certain embodiments. However, the technical scope of the present invention is not limited to the scope of the description of the embodiments. It is obvious to a person skilled in the art that various changes and modifications can be added to the above-described embodiments. It is obvious from the description of the appended claims that aspects after those changes and modifications are also encompassed by the technical scope of the present invention.

It is to be noted that the order of execution of respective processes in operations, procedures, steps, stages, and so forth in accordance of devices, systems, programs, and methods depicted in the appended claims as well as the specification and the drawings can be embodied in arbitrary order unless particularly instructed by expressions such as "prior to" and "in advance", or unless it is apparent that an output of a certain preceding process needs to be used in a subsequent process. Even if operation flows pertaining to the claims, the specification, and the drawings are described by using expressions such as "first" and "next" for the sake of convenience, such expressions do not mean that the operations flows have to be carried out in the order of enumeration.

The invention claimed is:

1. An exposure apparatus comprising:
   a formation module configured to form a plurality of charged particle beams with different irradiation positions on a specimen, wherein
   the formation module includes
   a particle source configured to emit the charged particle beams from an emission region in which a width in a longitudinal direction is different from a width in a lateral direction orthogonal to the longitudinal direction,
   an aperture array device provided with a plurality of openings arranged in an illuminated region in which a width in a longitudinal direction is different from a width in a lateral direction orthogonal to the longitudinal direction,
   an illumination lens provided between the particle source and the aperture array device, and
   a beam cross-section deformation device provided between the particle source and the aperture array device, and configured to deform a cross-sectional shape of the charged particle beams into a longer and thinner shape than a shape of the emission region by an action of any of a magnetic field and an electric field.

2. The exposure apparatus according to claim 1, wherein the particle source includes:
   a cathode unit having a tip end provided with a charged particle generation portion in which a width in a longitudinal direction is different from a width in a lateral direction orthogonal to the longitudinal direction, and
   a control electrode provided with an opening in which a width in a longitudinal direction is different from a width in a lateral direction orthogonal to the longitudinal direction.

3. The exposure apparatus according to claim 2, wherein the longitudinal direction of the opening of the control electrode is substantially parallel to the longitudinal direction of the generation portion, and
a line being substantially parallel to the longitudinal direction of the opening of the control electrode and the longitudinal direction of the generation portion, and bisecting the width in the lateral direction of the opening of the control electrode substantially coincides with a line bisecting the width in the lateral direction of the generation portion, when viewed in a direction of beam emission from the particle source.

4. The exposure apparatus according to claim 1, wherein the illumination lens is formed from at least two lenses including a particle source-side illumination lens and an aperture array-side illumination lens, the lenses being disposed at different positions.

5. The exposure apparatus according to claim 1, wherein the illumination lens is a charged particle beam lens being axisymmetric with respect to an optical axis where the charged particle beams pass.

6. The exposure apparatus according to claim 1, wherein the illumination lens is a rotation-free combination lens.

7. The exposure apparatus according to claim 4, wherein the beam cross-section deformation device is disposed between the particle source-side illumination lens and the aperture array-side illumination lens and at a position where an image of the emission region is focused with the particle source-side illumination lens.

8. The exposure apparatus according to claims 1, wherein the illuminated region on the aperture array device is provided at a position different from a position where an image of the emission region is focused with the illumination lens.

9. The exposure apparatus according to claim 2, wherein the generation portion has a substantially rectangular shape, and
a ratio of the width in the longitudinal direction to the width in the lateral direction of the generation portion is in a range from 5 to 50 inclusive.

10. The exposure apparatus according to claims 1, wherein a ratio of the width in the longitudinal direction to the width in the lateral direction of the illuminated region on the aperture array device is in a range from 500 to 1000 inclusive.

* * * * *